US012538591B2

(12) United States Patent
Tsugawa

(10) Patent No.: US 12,538,591 B2
(45) Date of Patent: Jan. 27, 2026

(54) IMAGING DEVICE

(71) Applicant: SONY SEMICONDUCTOR SOLUTIONS CORPORATION, Kanagawa (JP)

(72) Inventor: Hidenobu Tsugawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/197,515

(22) Filed: May 15, 2023

(65) Prior Publication Data

US 2023/0282678 A1  Sep. 7, 2023

Related U.S. Application Data

(63) Continuation of application No. 16/496,006, filed as application No. PCT/JP2018/015471 on Apr. 13, 2018, now Pat. No. 11,688,757.

(30) Foreign Application Priority Data

Apr. 28, 2017  (JP) ................................. 2017-089599

(51) Int. Cl.
*H01L 27/146* (2006.01)
*H10F 39/00* (2025.01)
(Continued)

(52) U.S. Cl.
CPC ......... *H10F 39/014* (2025.01); *H10F 39/018* (2025.01); *H10F 39/8037* (2025.01);
(Continued)

(58) Field of Classification Search
CPC ......... H01L 27/14689; H01L 27/14612; H01L 27/1463; H01L 27/1469; H01L 21/2007;
(Continued)

(56) References Cited

U.S. PATENT DOCUMENTS 8,558,292 B2 * 10/2013 Guidash .............. H01L 27/1464
257/292
8,878,325 B2 * 11/2014 Wan .................. H01L 27/14689
257/E31.124
(Continued)

FOREIGN PATENT DOCUMENTS

CN  104425439  3/2015
CN  106165099  11/2016
(Continued)

OTHER PUBLICATIONS

International Search Report and Written Opinion for International (PCT) Patent Application No. PCT/JP2018/015471, dated Jun. 26, 2018, 6 pages.
(Continued)

*Primary Examiner* — Jarrett J Stark
(74) *Attorney, Agent, or Firm* — SHERIDAN ROSS P.C.

(57) ABSTRACT

The present disclosure relates to a semiconductor device, a manufacturing method, an imaging element, and an electronic device capable of reducing manufacturing steps in a stacked structure obtained by stacking two or more semiconductor substrates. The semiconductor device has a stacked structure obtained by stacking at least a first semiconductor substrate in which a first wiring layer is stacked on a first semiconductor layer and a second semiconductor substrate in which a second wiring layer is stacked on a second semiconductor layer. Then, a through via which electrically connects the first semiconductor substrate and the second semiconductor substrate to each other and penetrates at least the first semiconductor layer is formed in an embedded oxide film formed when element isolation of a semiconductor element formed in the first semiconductor layer is performed. The present technology is applicable to, for example, a stacked semiconductor device.

19 Claims, 25 Drawing Sheets

(51) Int. Cl.
  *H01L 21/20* (2006.01)
  *H01L 23/48* (2006.01)
  *H01L 23/522* (2006.01)
  *H04N 25/79* (2023.01)

(52) U.S. Cl.
  CPC ........ *H10F 39/807* (2025.01); *H01L 21/2007* (2013.01); *H01L 23/481* (2013.01); *H01L 23/5226* (2013.01); *H04N 25/79* (2023.01); *H10F 39/811* (2025.01)

(58) Field of Classification Search
  CPC .............. H01L 23/481; H01L 23/5226; H01L 27/14636; H01L 27/14634; H01L 27/1464; H01L 21/76898; H04N 5/379; H10F 39/014; H10F 39/018; H10F 39/8037; H10F 39/807; H10F 39/811
  See application file for complete search history.

(56) References Cited

U.S. PATENT DOCUMENTS

| | | | | |
|---|---|---|---|---|
| 9,548,329 | B2* | 1/2017 | Lin | H01L 27/14689 |
| 10,903,089 | B1* | 1/2021 | Or-Bach | H01L 23/5226 |
| 10,950,647 | B2* | 3/2021 | Umebayashi | H04N 25/79 |
| 11,031,394 | B1* | 6/2021 | Or-Bach | G06F 30/39 |
| 11,056,432 | B2* | 7/2021 | Lee | H01L 23/3128 |
| 2002/0025604 | A1* | 2/2002 | Tiwari | H01L 21/76254 257/E21.582 |
| 2005/0029643 | A1* | 2/2005 | Koyanagi | H01L 27/14627 257/E31.118 |
| 2007/0069258 | A1* | 3/2007 | Ahn | H01L 27/1464 257/292 |
| 2008/0251823 | A1* | 10/2008 | Lee | H01L 27/14634 257/292 |
| 2010/0248412 | A1* | 9/2010 | Guidash | H01L 27/1464 257/E31.127 |
| 2011/0096215 | A1 | 4/2011 | Choi et al. | |
| 2011/0155893 | A1* | 6/2011 | Endo | H01L 27/1464 257/292 |
| 2015/0060967 | A1 | 3/2015 | Yokoyama et al. | |
| 2015/0171146 | A1* | 6/2015 | Ooki | H01L 27/14636 257/40 |
| 2015/0221695 | A1* | 8/2015 | Park | H01L 23/481 257/774 |
| 2016/0307823 | A1* | 10/2016 | Fang | H01L 27/14687 |
| 2017/0092680 | A1* | 3/2017 | Kwon | H01L 24/32 |
| 2017/0200716 | A1* | 7/2017 | Or-Bach | H01L 27/0688 |
| 2018/0005940 | A1* | 1/2018 | Chen | H01L 25/0657 |
| 2018/0025970 | A1* | 1/2018 | Kao | H01L 27/0688 257/401 |
| 2018/0240797 | A1* | 8/2018 | Yokoyama | H01L 23/528 |
| 2019/0057959 | A1* | 2/2019 | Or-Bach | H01L 21/76259 |
| 2019/0157333 | A1* | 5/2019 | Tsai | H01L 21/78 |
| 2019/0363079 | A1* | 11/2019 | Thei | H01L 23/481 |
| 2020/0092506 | A1* | 3/2020 | Park | H01L 25/18 |
| 2020/0105815 | A1* | 4/2020 | Huang | H01L 23/552 |
| 2020/0135617 | A1* | 4/2020 | Shen | H01L 27/14634 |
| 2020/0251518 | A1* | 8/2020 | Ogino | H01L 24/08 |
| 2021/0066378 | A1* | 3/2021 | Tsai | H01L 27/14683 |
| 2021/0111204 | A1* | 4/2021 | Hagimoto | H01L 25/16 |
| 2021/0118937 | A1 | 4/2021 | Tsugawa | |

FOREIGN PATENT DOCUMENTS

| | | |
|---|---|---|
| JP | 2001-339057 | 12/2001 |
| JP | 2005-252279 | 9/2005 |
| JP | 2011-091400 | 5/2011 |
| JP | 2014-207252 | 10/2014 |
| JP | 2015-065407 | 9/2015 |
| WO | WO 2003/041174 | 5/2003 |

OTHER PUBLICATIONS

Official Action for U.S. Appl. No. 16/496,006, dated Jun. 14, 2021, 9 pages.
Official Action for U.S. Appl. No. 16/496,006, dated Oct. 7, 2021, 16 pages.
Official Action for U.S. Appl. No. 16/496,006, dated Feb. 4, 2022, 15 pages.
Official Action for U.S. Appl. No. 16/496,006, dated Feb. 18, 2022, 19 pages.
Official Action for U.S. Appl. No. 16/496,006, dated May 27, 2022, 20 pages.
Official Action for U.S. Appl. No. 16/496,006, dated Jun. 17, 2022, 24 pages.
Official Action for U.S. Appl. No. 16/496,006, dated Dec. 5, 2022, 4 pages.
Notice of Allowance for U.S. Appl. No. 16/496,006, dated Feb. 14, 2023, 5 pages.
Corrected Notice of Allowance for U.S. Appl. No. 16/496,006, dated Mar. 8, 2023, 2 pages.

* cited by examiner

IMAGING DEVICE

CROSS REFERENCE TO RELATED APPLICATIONS

This application is a continuation of U.S. patent application Ser. No. 16/496,006, filed 20 Sep. 2019, which is a national stage application under 35 U.S.C. 371 and claims the benefit of PCT Application No. PCT/JP2018/015471 having an international filing date of 13 Apr. 2018, which designated the United States, which PCT application claimed the benefit of Japanese Patent Application No. 2017-089599 filed 28 Apr. 2017, the entire disclosures of each of which are incorporated herein by reference.

TECHNICAL FIELD

The present disclosure relates to a semiconductor device, a manufacturing method, an imaging element, and an electronic device, and especially relates to a semiconductor device, a manufacturing method, an imaging element, and an electronic device capable of reducing manufacturing steps in a stacked structure obtained by stacking two or more semiconductor substrates.

BACKGROUND ART

At present, in semiconductor devices, a stacked structure obtained by stacking a plurality of semiconductor substrates begins to be adopted in order to reduce a chip area, suppress wiring resistance, and reduce power consumption. Especially mass production is actually performed as a high bandwidth memory (HBM) in a dynamic random access memory (DRAM) and as a stacked CIS in a CMOS image sensor (CIS).

Furthermore, as a method of electrically connecting semiconductor substrates of the stacked structure to each other, for example, a through silicon via (through Si via; TSV), a µ bump, Cu—Cu direct bonding and the like are used. Among them, the through silicon via is extensively developed.

For example, Patent Document 1 discloses a semiconductor device in which a storage element provided on a back surface of a semiconductor substrate and a transistor provided on a surface of the semiconductor substrate are electrically connected to each other by using a contact plug extended to penetrate an isolation region of the semiconductor substrate.

CITATION LIST

Patent Document

Patent Document 1: Japanese Patent Application Laid-Open No. 2015-065407

SUMMARY OF THE INVENTION

Problems to be Solved by the Invention

As described above, the semiconductor device of the stacked structure obtained by stacking two or more semiconductor substrates has been conventionally developed; however, from a viewpoint of simplification of manufacturing steps, suppression of a manufacturing cost and the like, for example, further reduction in the manufacturing steps is required.

The present disclosure is achieved in view of such a situation, and an object thereof is to reduce the manufacturing steps in the stacked structure obtained by stacking two or more semiconductor substrates.

Solutions to Problems

A semiconductor device according to an aspect of the present disclosure is provided with a first semiconductor substrate in which a first wiring layer is stacked on a first semiconductor layer, a second semiconductor substrate in which a second wiring layer is stacked on a second semiconductor layer, and a through via which electrically connects the first semiconductor substrate and the second semiconductor substrate to each other in a stacked structure obtained by stacking at least the first semiconductor substrate and the second semiconductor substrate and penetrates at least the first semiconductor layer, in which the through via is formed in an embedded oxide film formed when element isolation of a semiconductor element formed in the first semiconductor layer is performed.

A manufacturing method according to an aspect of the present disclosure is a manufacturing method of a semiconductor device of a stacked structure obtained by stacking at least a first semiconductor substrate in which a first wiring layer is stacked on a first semiconductor layer and a second semiconductor substrate in which a second wiring layer is stacked on a second semiconductor layer, the manufacturing method provided with a step of electrically connecting the first semiconductor substrate and the second semiconductor substrate to each other in the stacked structure obtained by stacking at least the first semiconductor substrate and the second semiconductor substrate, and forming a through via which penetrates at least the first semiconductor layer in an embedded oxide film formed when element isolation of a semiconductor element formed in the first semiconductor layer is performed.

An imaging element according to an aspect of the present disclosure is provided with a sensor substrate in which a first wiring layer is stacked on a first semiconductor layer, a logic substrate in which a second wiring layer is stacked on a second semiconductor layer, and a through via which electrically connects the sensor substrate and the logic substrate to each other in a stacked structure obtained by stacking at least the sensor substrate and the logic substrate and penetrates at least the first semiconductor layer, in which the through via is formed in an embedded oxide film formed when element isolation of a semiconductor element formed in the first semiconductor layer is performed.

An electronic device according to an aspect of the present disclosure is provided with an imaging element including a sensor substrate in which a first wiring layer is stacked on a first semiconductor layer, a logic substrate in which a second wiring layer is stacked on a second semiconductor layer, and a through via which electrically connects the sensor substrate and the logic substrate to each other in a stacked structure obtained by stacking at least the sensor substrate and the logic substrate and penetrates at least the first semiconductor layer, in which the through via is formed in an embedded oxide film formed when element isolation of a semiconductor element formed in the first semiconductor layer is performed.

In an aspect of the present disclosure, in a stacked structure obtained by at least stacking a first semiconductor substrate in which a first wiring layer is stacked on a first semiconductor layer and a second semiconductor substrate in which a second wiring layer is stacked on a second semiconductor layer, a through via which electrically connects the first semiconductor substrate and the second semiconductor substrate to each other and penetrates at least the first semiconductor layer is formed in an embedded oxide film formed when element isolation of a semiconductor element formed in the first semiconductor layer is performed.

Effects of the Invention

According to one aspect of the present disclosure, it is possible to reduce the manufacturing steps in the stacked structure in which two or more semiconductor substrates are stacked.

Note that, the effects are not necessarily limited to the effects herein described and may include any of the effects described in the present disclosure.

MODE FOR CARRYING OUT THE INVENTION

Hereinafter, specific embodiments to which the present technology is applied are described in detail with reference to the drawings.

First Configuration Example of Semiconductor Device

Figure 1:
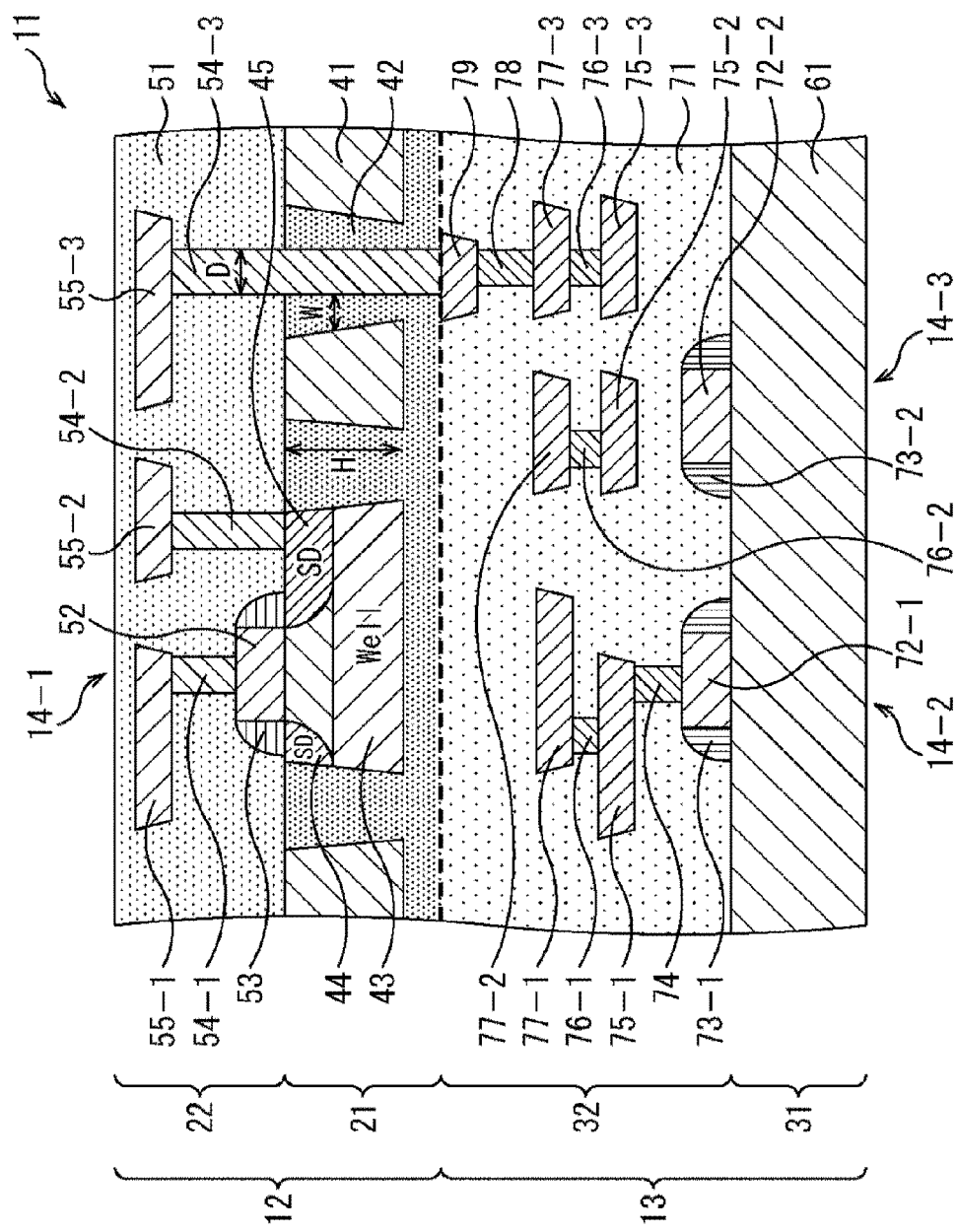
FIG. 1 is a cross-sectional view illustrating a configuration example of a first embodiment of a semiconductor device to which the present technology is applied.

FIG. 1 is a cross-sectional view illustrating a configuration example of a first embodiment of a semiconductor device to which the present technology is applied.

As illustrated in FIG. 1, a semiconductor device 11 has a stacked structure obtained by stacking an upper silicon substrate 12 and a lower silicon substrate 13 in which a semiconductor element such as a metal-oxide-semiconductor (MOS) transistor 14 is formed. In the configuration example of the semiconductor device 11 illustrated in FIG. 1, a cross-section in a site in which a MOS transistor 14-1 is formed in the upper silicon substrate 12 and MOS transistors 14-2 and 14-3 are formed on the lower silicon substrate 13 is illustrated.

The upper silicon substrate 12 is formed by stacking a wiring layer 22 on a semiconductor layer 21, and the lower silicon substrate 13 is formed by stacking a wiring layer 32 on a semiconductor layer 31. Then, the semiconductor device 11 has a configuration in which the semiconductor layer 21 of the upper silicon substrate 12, the lower silicon substrate 13, and the wiring layer 32 are electrically and mechanically joined on a joining surface (surface indicated by broken line in FIG. 1).

The semiconductor layer 21 is formed, for example, by embedding an embedded oxide film 42 having an insulation property in a semiconductor region 41 formed by using a semiconductor such as single crystal silicon. The embedded oxide film 42 is used as an isolation region for isolating the semiconductor element such as the MOS transistor 14-1 formed in the semiconductor region 41, and is also used to insulate a through via 54-3 from the semiconductor region 41 in the example illustrated in FIG. 1. In other words, the embedded oxide film 42 is formed when element isolation of the semiconductor element is performed.

In the semiconductor region 41, an N-type well 43 to be a region for forming the MOS transistor 14-1, a P-type region 44 to be one of a source or a drain, and a P-type region 45 to be the other of the source or the drain are formed. Furthermore, a gate electrode 52 of the MOS transistor 14-1 is arranged between the P-type region 44 and the P-type region 45 on a surface of the semiconductor layer 21, and a sidewall 53 is formed to surround a periphery of the gate electrode 52.

In the wiring layer 22, a plurality of wires 55 is arranged in a multi-layered manner so as to be insulated by an insulating film 51. In the example illustrated in FIG. 1, in the wiring layer 22, three wires 55-1 to 55-3 are arranged; the wire 55-1 is connected to the gate electrode 52 via a contact electrode 54-1 and the wire 55-2 is connected to the P-type region 45 via a contact electrode 54-2. Furthermore, the wire 55-3 is connected to an upper layer wire 79 formed in the wiring layer 32 of the lower silicon substrate 13 via the through via 54-3.

Here, as is the case with the contact electrodes 54-1 and 54-2, the through via 54-3 is formed to penetrate the embedded oxide film 42 embedded in the semiconductor region 41 of the semiconductor layer 21 by using conductive metal such as tungsten. For example, the through via 54-3 is designed to have a size with a diameter D equal to or larger than 70 nm, the size equivalent to that of the contact electrodes 54-1 and 54-2, and is formed to penetrate the embedded oxide film 42 embedded with a depth H of about 200 nm. Furthermore, a width W of the embedded oxide film 42 formed around the through via 54-3, in other words, a distance from a side surface of the through via 54-3 to the semiconductor region 41 is designed to be about 10 to 100 nm such that an insulation property therebetween may be maintained. However, in order to suppress capacitance between the semiconductor region 41 and the through via 54-3, the width W of the embedded oxide film 42 may be designed to be 100 nm or larger.

Figure 2:
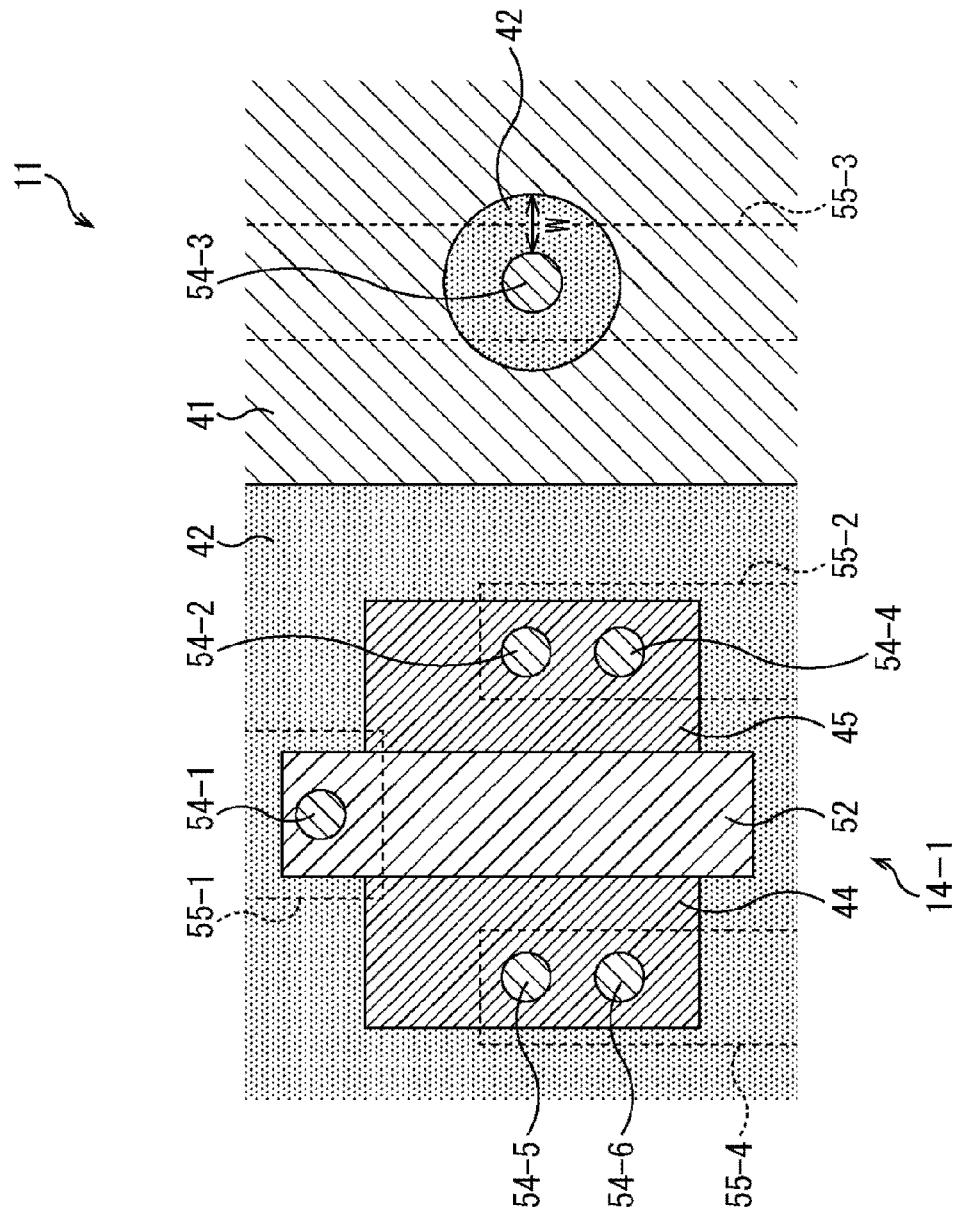
FIG. 2 is a view schematically illustrating a planar configuration example of the semiconductor device.

For example, as illustrated in a planar manner in FIG. 2, the through via 54-3 is formed inside the embedded oxide film 42, and the distance from the through via 54-3 to the semiconductor region 41, in other words, the width W of the embedded oxide film 42 around the through via 54-3 is designed to be about 10 to 100 nm.

The semiconductor layer 31 includes a semiconductor region 61 formed by using a semiconductor such as single crystal silicon, and on a surface of the semiconductor layer 31, a gate electrode 72-1 forming the MOS transistor 14-2 and a gate electrode 72-2 forming the MOS transistor 14-3 are arranged. Furthermore, a sidewall 73-1 is formed so as to surround a periphery of the gate electrode 72-1, and a sidewall 73-2 is formed so as to surround a periphery of the gate electrode 72-2.

In the wiring layer 32, a plurality of wires is arranged in a multi-layered manner so as to be insulated by an insulating film 71; in the example in FIG. 1, two layers of wires 75-1 to 75-3 and wires 77-1 to 77-3 are arranged, the upper layer wire 79 is arranged so as to be exposed to a surface of the wiring layer 32. For example, in the wiring layer 32, the wire 75-1 is connected to the gate electrode 72-1 via a contact electrode 74 and connected to the wire 77-1 via a contact electrode 76-1. Furthermore, in the wiring layer 32, the wires 75-2 and 77-2 are connected to each other via a contact electrode 76-2, the wires 75-3 and 77-3 are connected to each other via a contact electrode 76-3, and the wire 77-3 and the upper layer wire 79 are connected to each other via a contact electrode 78.

In the semiconductor device 11 having such a configuration, manufacturing steps may be reduced by forming the through via 54-3 inside the embedded oxide film 42 formed when the element isolation of the MOS transistor 14-1 formed in the semiconductor layer 21 is performed. As a result, cost reduction of the semiconductor device 11 may be realized.

Note that, the semiconductor device 11 has a two-layer structure of at least the upper silicon substrate 12 and the lower silicon substrate 13, and the through via 54-3 may be adopted to all electrical connections provided between them. Furthermore, the semiconductor device 11 may have a multi-layer structure of two or more layers, and in this case also, the through via 54-3 may be adopted to electrical connection between multi-layer silicon substrates.

<First Manufacturing Method of Semiconductor Device>

A manufacturing method of the semiconductor device 11 is described with reference to FIGS. 3 to 10.

Figure 3:
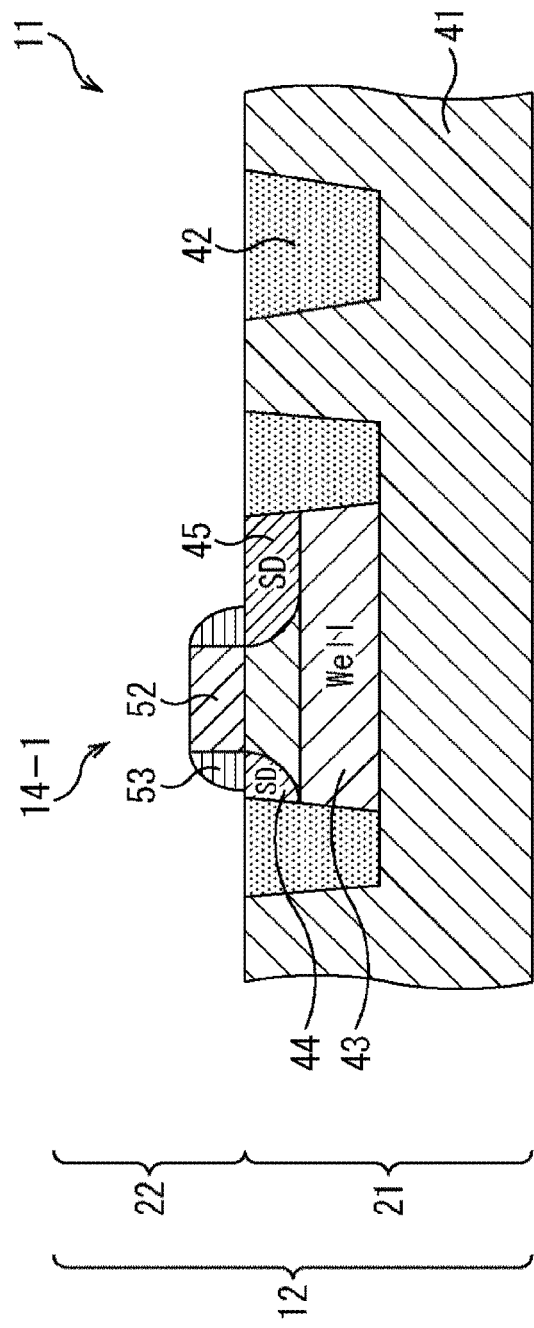
FIG. 3 is a view for illustrating a first step of a manufacturing method of the semiconductor device.

As illustrated in FIG. 3, at a first step, in the semiconductor layer 21 of the upper silicon substrate 12, the embedded oxide film 42 is embedded in the semiconductor region 41 to be a site where the through via 54-3 is formed simultaneously with the element isolation of the region where the MOS transistor 14-1 is formed. Thereafter, the MOS transistor 14-1 is formed in the semiconductor layer 21.

Figure 4:
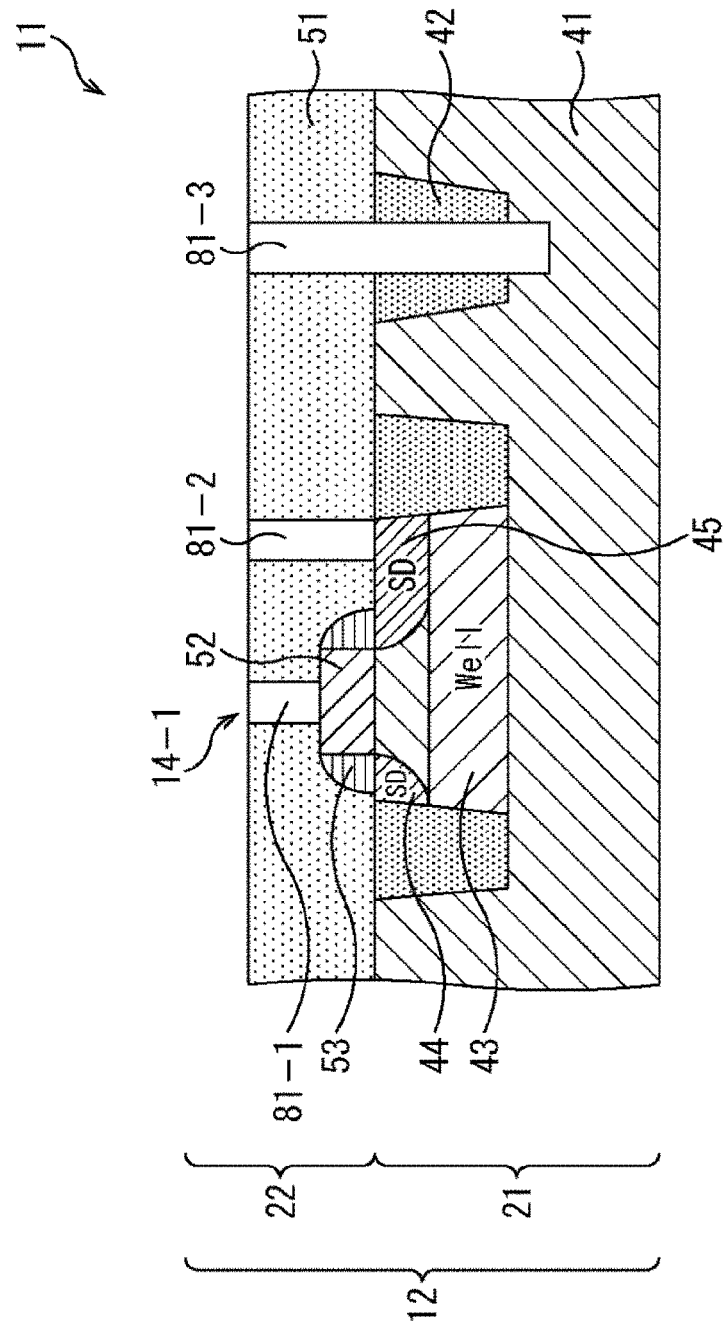
FIG. 4 is a view for illustrating a second step of the manufacturing method of the semiconductor device.

As illustrated in FIG. 4, at a second step, the insulating film 51 is formed on the semiconductor layer 21 and through holes 81-1 to 81-3 are formed in the insulating film 51. The through hole 81-1 is processed to open to the gate electrode 52 and the through hole 81-2 is processed to open to the P-type region 45. Furthermore, the through hole 81-3 is opened as deep as or deeper than a thickness of the embedded oxide film 42 so as to penetrate the embedded oxide film 42 to reach the semiconductor region 41.

Figure 5:
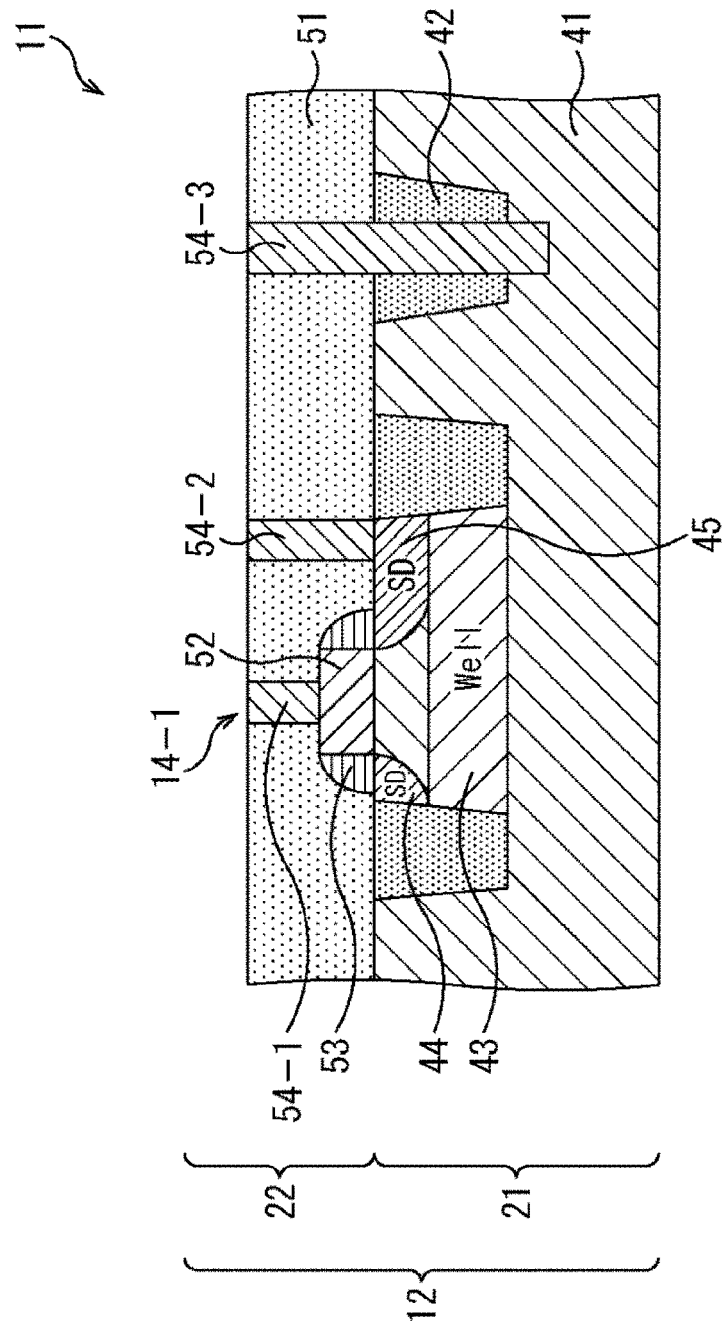
FIG. 5 is a view for illustrating a third step of the manufacturing method of the semiconductor device.

As illustrated in FIG. 5, at a third step, sputtering or chemical vapor deposition (CVD) is performed to form a barrier metal film, conductive metal such as tungsten is embedded in the through holes 81-1 to 81-3, and thereafter, etching back is performed by chemical mechanical polishing (CMP) to remove unnecessary metal. As a result, the through via 54-3 is formed simultaneously with the contact electrodes 54-1 and 54-2.

Figure 6:
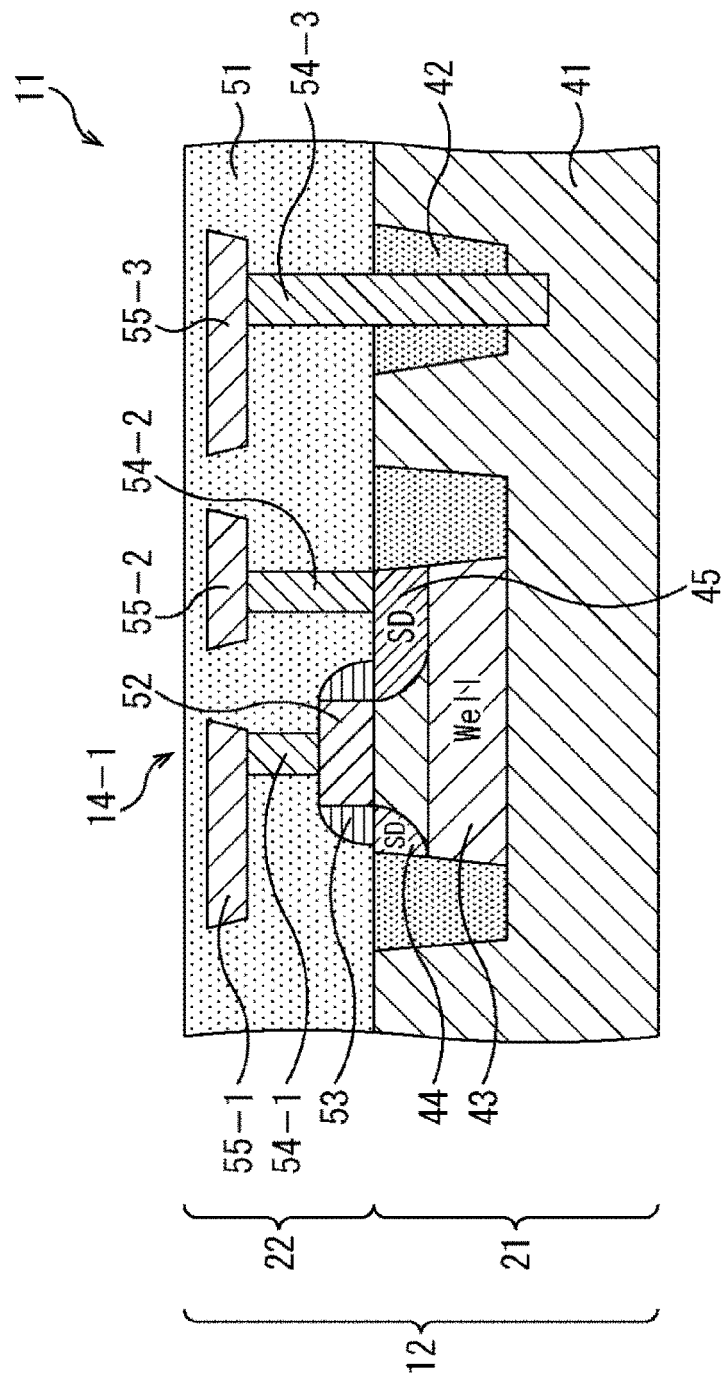
FIG. 6 is a view for illustrating a fourth step of the manufacturing method of the semiconductor device.

As illustrated in FIG. 6, at a fourth step, the wires 55-1 to 55-3 are formed by a normal CMOS process.

Figure 7:
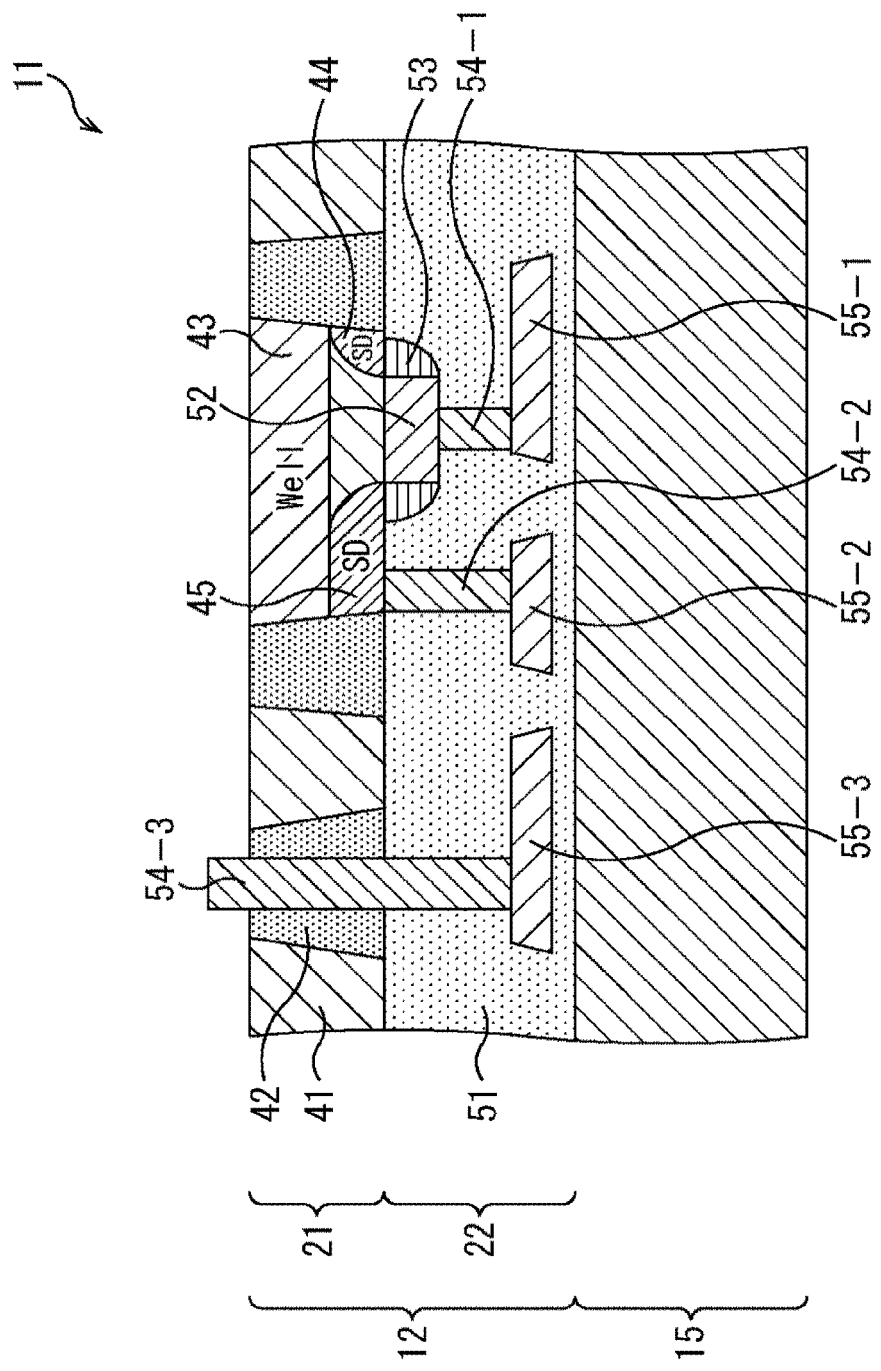
FIG. 7 is a view for illustrating a fifth step of the manufacturing method of the semiconductor device.

As illustrated in FIG. 7, at a fifth step, a support substrate 15 is bonded to the wiring layer 22 on a surface side of the upper silicon substrate 12. Thereafter, the CMP and the like is performed on the semiconductor layer 21 on a back surface side of the upper silicon substrate 12 to grind until the through via 54-3 and the embedded oxide film 42 are exposed to the surface. At that time, the CMP is performed such that the through via 54-3 is left projecting about 100 nm from the semiconductor layer 21, for example.

Figure 8:
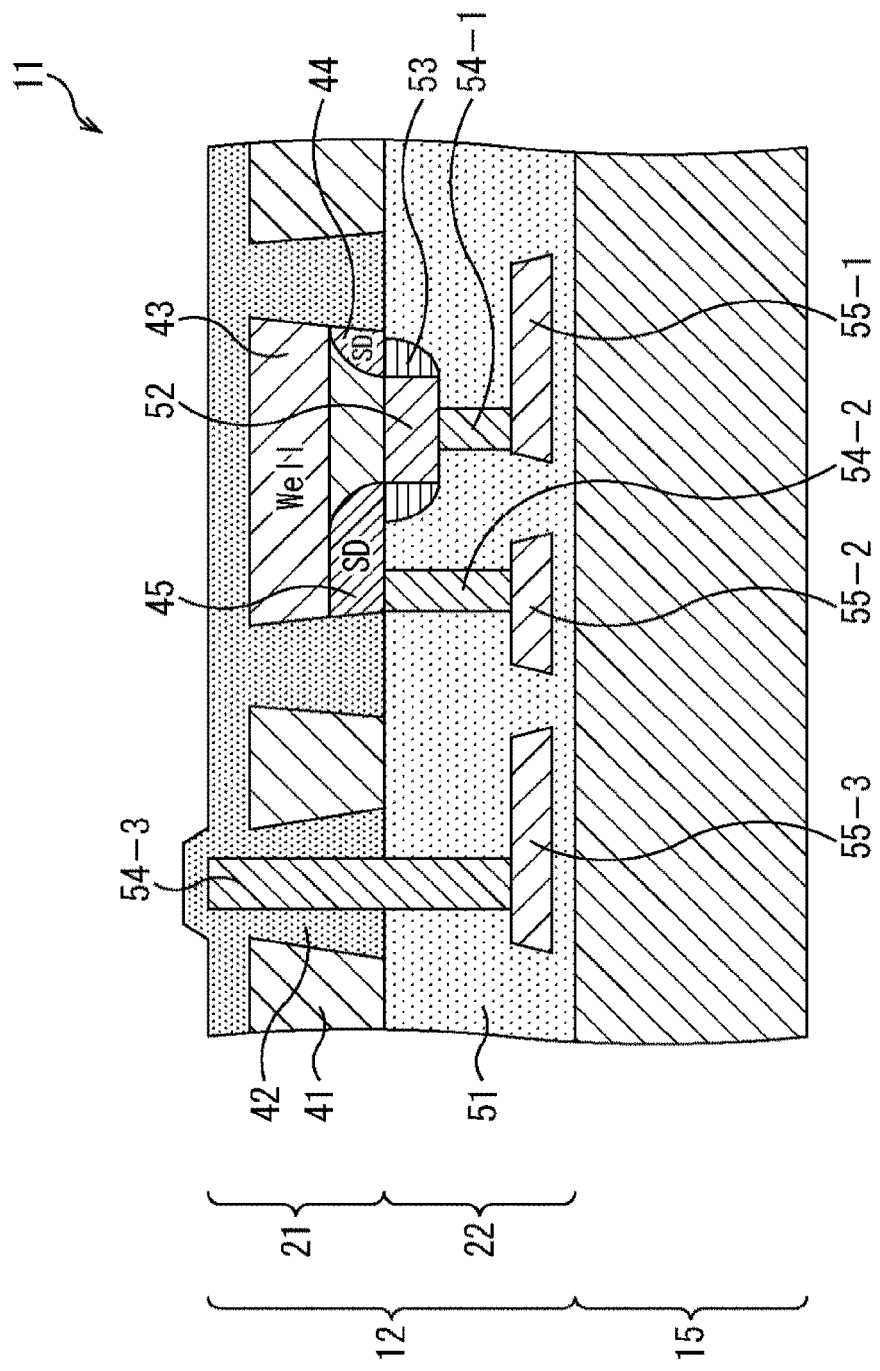
FIG. 8 is a view for illustrating a sixth step of the manufacturing method of the semiconductor device.

As illustrated in FIG. 8, at a sixth step, in order to secure an insulation property between the upper silicon substrate 12 and the upper layer wire 79 formed in the wiring layer 32 of the lower silicon substrate 13, an oxide film similar to the embedded oxide film 42 is formed on the semiconductor layer 21 with a thickness of about 100 nm.

Figure 9:
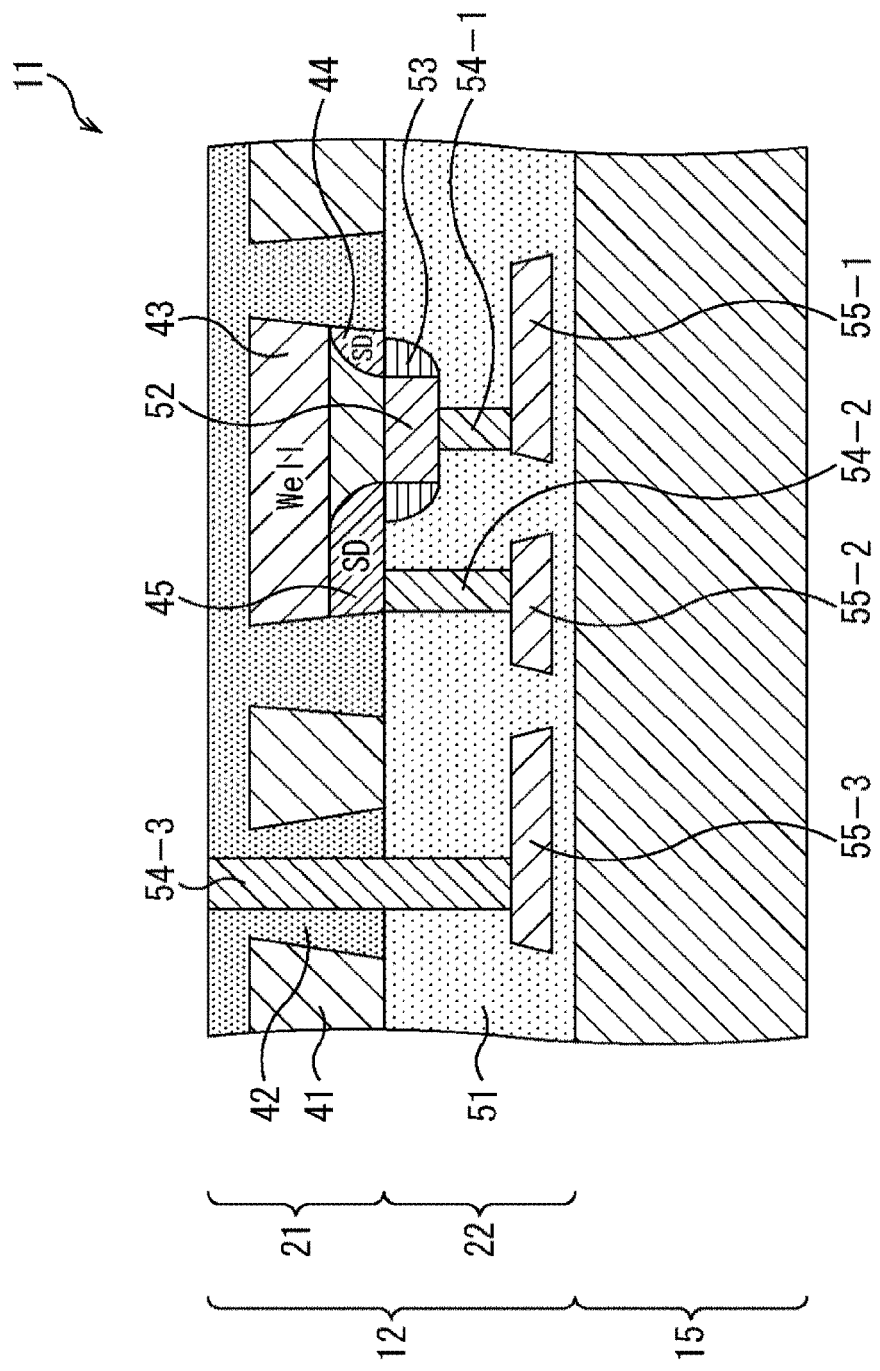
FIG. 9 is a view for illustrating a seventh step of the manufacturing method of the semiconductor device.

As illustrated in FIG. 9, at a seventh step, the oxide film formed at the sixth step is polished by the CMP or the like to expose a tip end surface of the through via 54-3.

Figure 10:
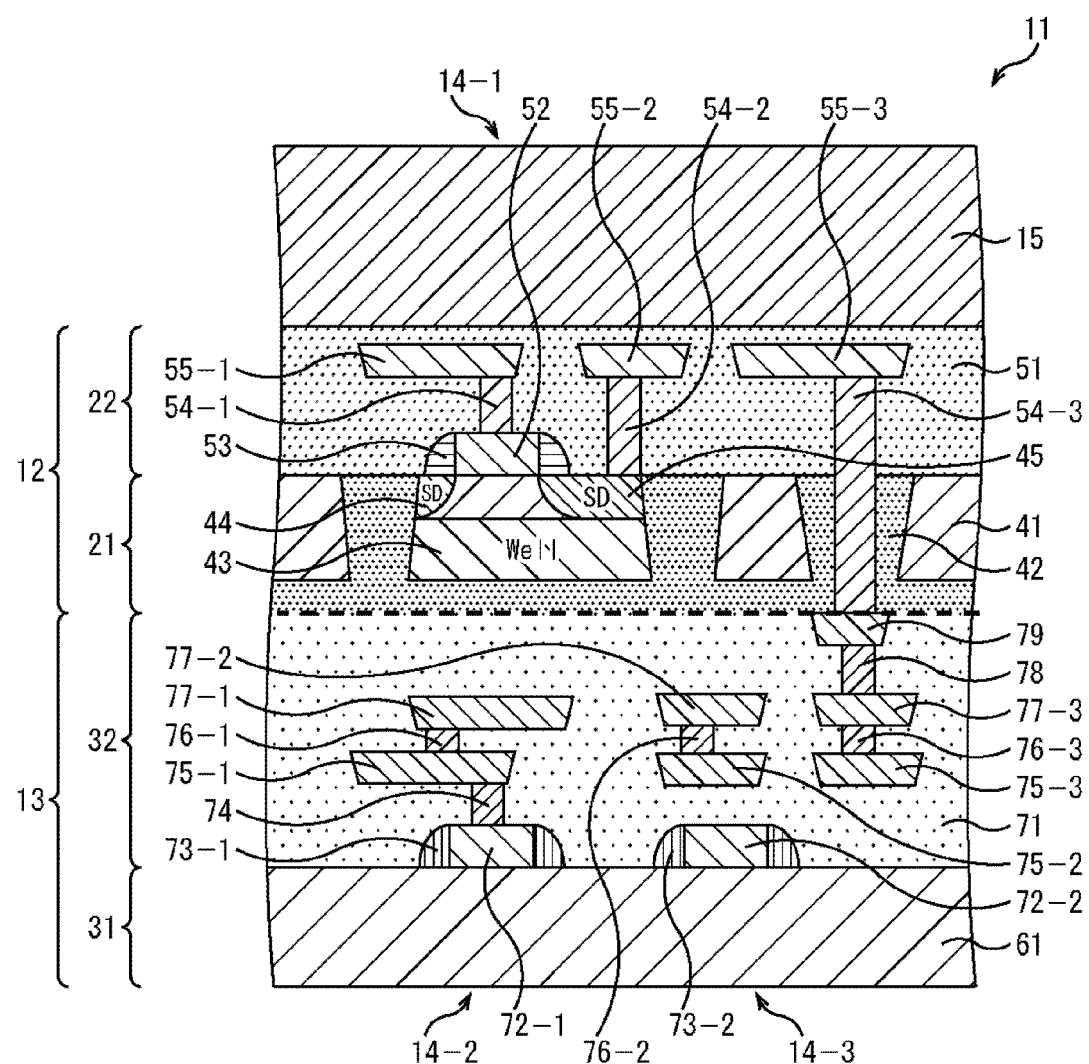
FIG. 10 is a view for illustrating an eighth step of the manufacturing method of the semiconductor device.

As illustrated in FIG. 10, at an eighth step, the upper silicon substrate 12 and the lower silicon substrate 13 separately prepared are bonded to each other. At that time, the exposed tip end surface of the through via 54-3 and the upper layer wire 79 of the lower silicon substrate 13 are aligned and joined by direct bonding.

Thereafter, the support substrate 15 is removed and the semiconductor device 11 as illustrated in FIG. 1 is manufactured.

As described above, in the semiconductor device 11, the manufacturing steps may be reduced by forming the through via 54-3 inside the embedded oxide film 42 formed when performing the element isolation of the MOS transistor 14-1 formed in the semiconductor layer 21 is performed. In other words, by providing the through via 54-3 inside the embedded oxide film 42, the semiconductor device 11 may have a structure in which the through via 54-3 is not in contact with the semiconductor region 41. As a result, for example, it is possible to reduce a step of forming an insulating film for the through holes 81-3 after forming the through holes 81-3 (FIG. 4) for providing the through via 54-3.

Furthermore, in the semiconductor device 11, the contact electrodes 54-1 and 54-2 and the through via 54-3 may be formed at the same step (third step in FIG. 5) by forming the through via 54-3 by using the same metal as that of the contact electrodes 54-1 and 54-2. The manufacturing step of the semiconductor device 11 may be reduced also with this arrangement.

Furthermore, in the semiconductor device 11, a thickness of the semiconductor layer 21 through which the through via 54-3 penetrates may be substantially the same as or smaller than the thickness (depth H illustrated in FIG. 1) of the embedded oxide film 42 to be the element isolation region of the MOS transistor 14-1. As a result, a depth of the through hole 81-3 for forming the through via 54-3 may be made small, and a working time required for processing the through hole 81-3, a working time required for embedding the conductive metal in the through hole 81-3 and the like may be made shorter, for example.

Furthermore, the semiconductor device 11 in which the thickness of the semiconductor layer 21 is made smaller than that in the conventional art and it is not necessary to dig the through via 54-3 deeply may be manufactured without using a dedicated device for increasing an aspect ratio (ratio of depth to diameter) for processing the through hole 81-3, for example. Moreover, in the semiconductor device 11, a diameter of the through via 54-3 may be reduced by reducing a depth of the through via 54-3, and a chip area may be reduced as compared with that in the conventional art.

Second Configuration Example of Semiconductor Device

Figure 11:
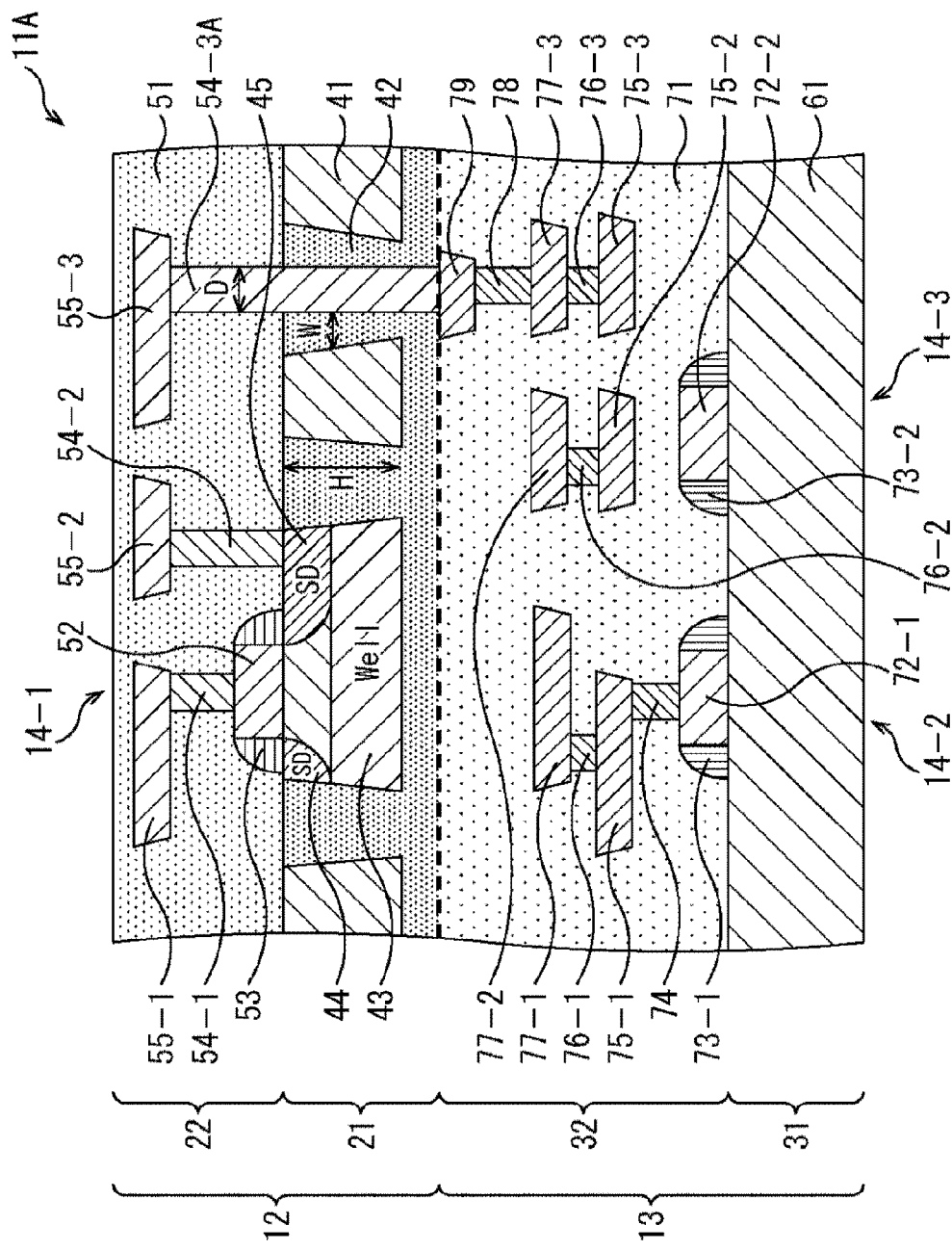
FIG. 11 is a cross-sectional view illustrating a configuration example of a second embodiment of a semiconductor device.

FIG. 11 is a cross-sectional view illustrating a configuration example of a second embodiment of a semiconductor device. Note that, in a semiconductor device 11A illustrated in FIG. 11, the same reference sign is given to a configuration common to that of the semiconductor device 11 in FIG. 1, and the detailed description thereof is not repeated.

The semiconductor device 11A illustrated in FIG. 11 has a configuration different from that of the semiconductor device 11 in FIG. 1 in that a through via 54-3A is formed by using the same conductive metal (for example, copper) as that of a wire 55. In other words, in the semiconductor device 11 in FIG. 1, the through via 54-3 is formed by using the same metal as that of the contact electrodes 54-1 and 54-2, whereas in the semiconductor device 11A, the through via 54-3A is formed by using the same metal as that of the wire 55.

Accordingly, in the semiconductor device 11A, the through via 54-3 and the wire 55 may be formed at the same step, and manufacturing steps may be reduced.

<Second Manufacturing Method of Semiconductor Device>

A manufacturing method of the semiconductor device 11A is described with reference to FIGS. 12 to 17.

Figure 12:
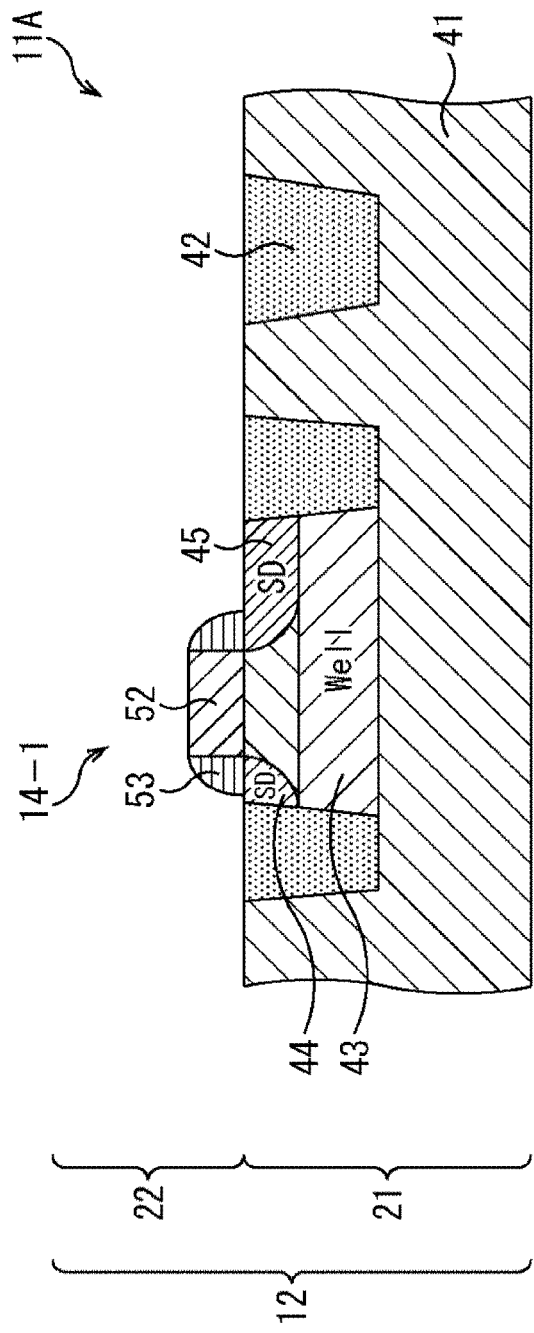
FIG. 12 is a view for illustrating an eleventh step of a manufacturing method of the semiconductor device.

As illustrated in FIG. 12, at an eleventh step, in a semiconductor layer 21 of an upper silicon substrate 12, an embedded oxide film 42 is embedded in a semiconductor region 41 to be a site where the through via 54-3 is formed simultaneously with element isolation of a region where a MOS transistor 14-1 is formed. Thereafter, the MOS transistor 14-1 is formed in the semiconductor layer 21.

Figure 13:
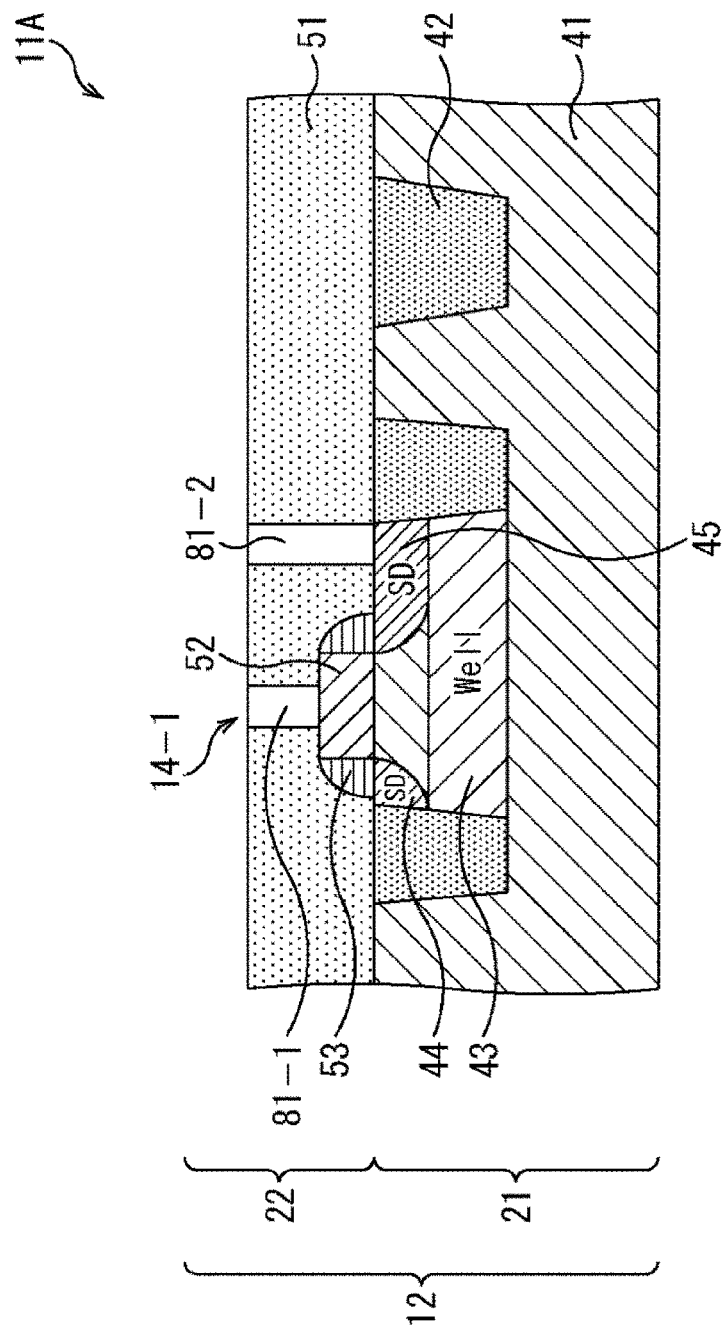
FIG. 13 is a view for illustrating a twelfth step of the manufacturing method of the semiconductor device.

As illustrated in FIG. 13, at a twelfth step, an insulating film 51 is formed on the semiconductor layer 21 and through holes 81-1 and 81-2 are formed in the insulating film 51. The through hole 81-1 is processed to open to the gate electrode 52 and the through hole 81-2 is processed to open to the P-type region 45.

Figure 14:
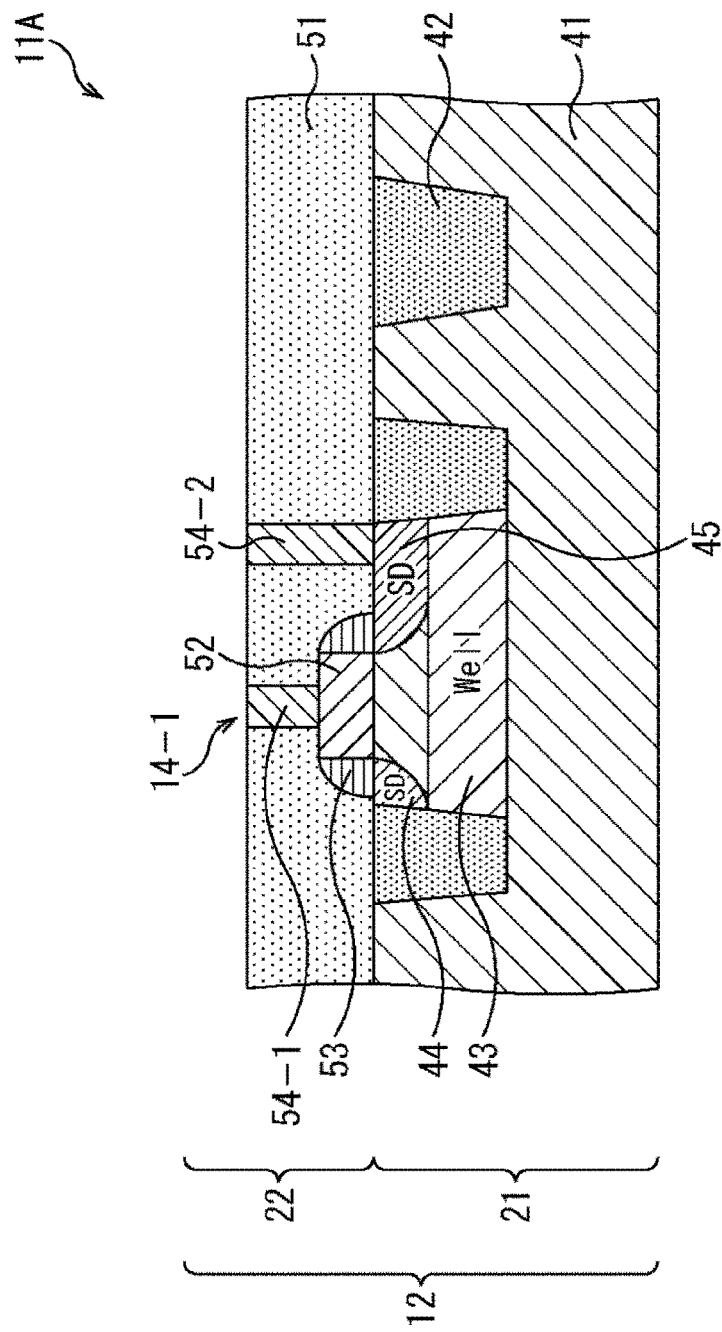
FIG. 14 is a view for illustrating a thirteenth step of the manufacturing method of the semiconductor device.

As illustrated in FIG. 14, at a thirteenth step, chemical vapor deposition (CVD) is performed to embed conductive metal such as tungsten in the through holes 81-1 and 81-2, and after that, etching back is performed by chemical mechanical polishing (CMP) to remove unnecessary metal. As a result, contact electrodes 54-1 and 54-2 are formed.

Figure 15:
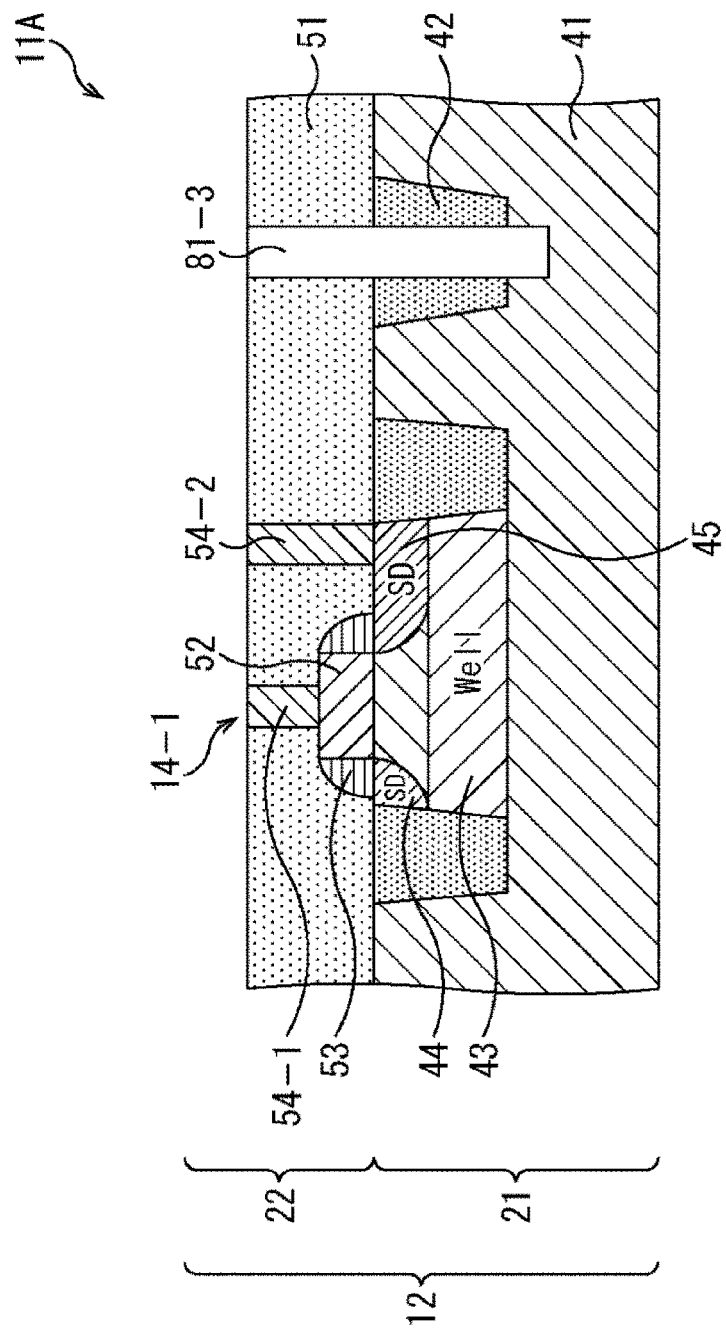
FIG. 15 is a view for illustrating a fourteenth step of the manufacturing method of the semiconductor device.

As illustrated in FIG. 15, at a fourteenth step, a through hole 81-3 for forming the through via 54-3A is formed to penetrate the insulating film 51 and the embedded oxide film 42. At that time, the through hole 81-3 is opened as deep as or deeper than a thickness of the embedded oxide film 42 so as to penetrate the embedded oxide film 42 to reach the semiconductor region 41.

Figure 16:
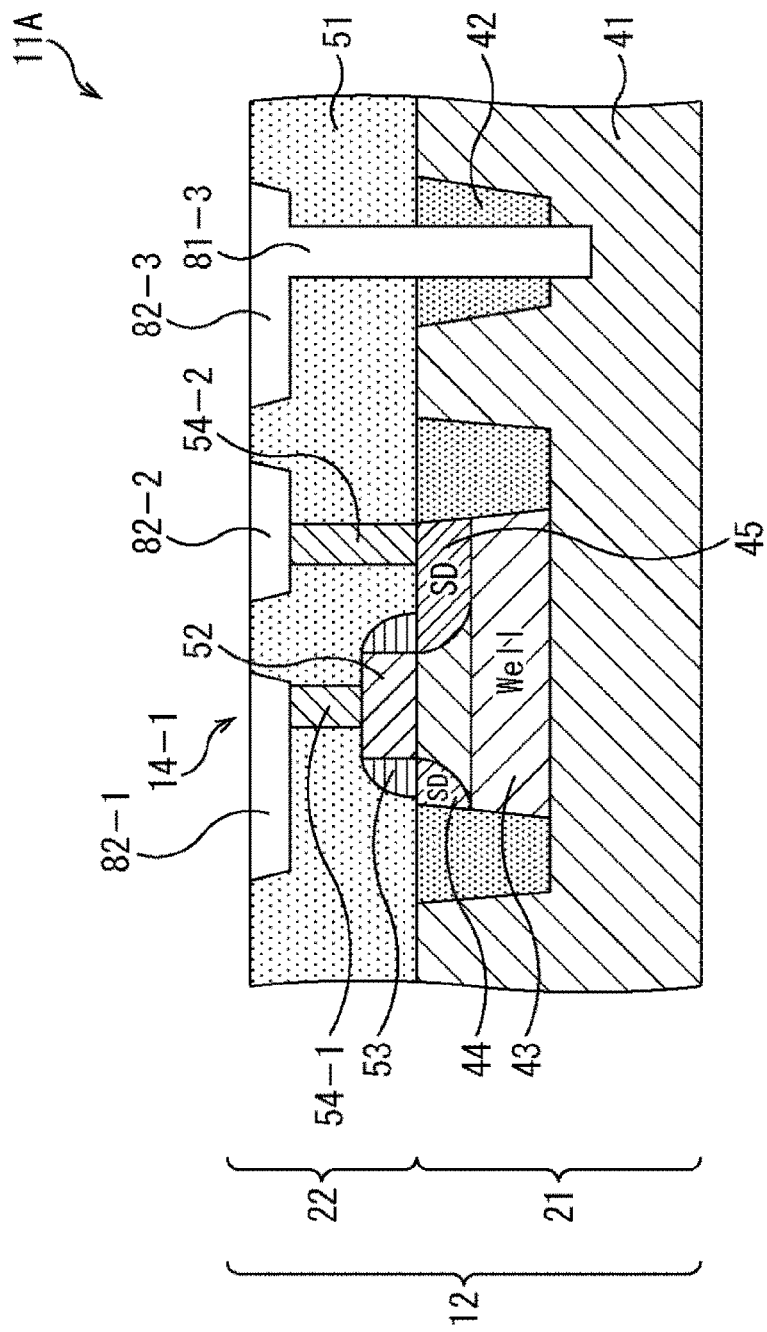
FIG. 16 is a view for illustrating a fifteenth step of the manufacturing method of the semiconductor device.

As illustrated in FIG. 16, at a fifteenth step, wiring patterns 82-1 to 82-3 for forming the wires 55-1 to 55-3 are formed.

Figure 17:
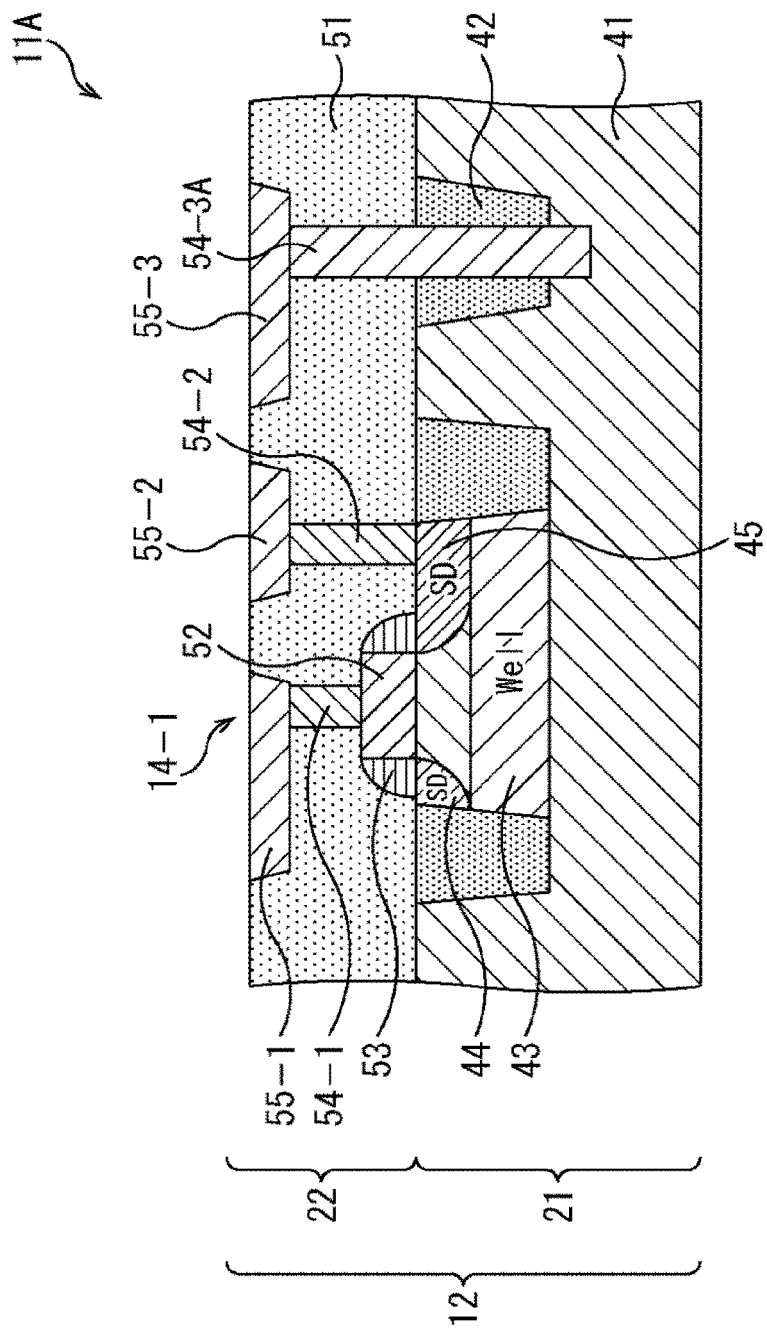
FIG. 17 is a view for illustrating a sixteenth step of the manufacturing method of the semiconductor device.

As illustrated in FIG. 17, at a sixteenth step, sputtering, plating and the like are performed to form barrier metal films on the wiring patterns 82-1 to 82-3 and the through holes 81-3, and the conductive metal is embedded. As a result, the wires 55-1 to 55-3 and the through via 54-3A are formed.

Thereafter, after steps similar to the fifth to eighth steps described with reference to FIGS. 7 to 10 described above are performed, a support substrate 15 is removed to manufacture the semiconductor device 11A as illustrated in FIG. 11.

As described above, in the semiconductor device 11A, the wire 55 and the through via 54-3A may be formed at the same step (sixteenth step in FIG. 17) by forming the through via 54-3A by using the same metal as that of the wire 55. The manufacturing steps of the semiconductor device 11A may be reduced with this arrangement.

It goes without saying that, in the semiconductor device 11A as is the case with the semiconductor device 11 in FIG. 1, the manufacturing steps may be reduced also by forming the through via 54-3 inside the embedded oxide film 42 formed when the element isolation of the MOS transistor 14-1 formed in the semiconductor layer 21 is performed.

Third to Sixth Configuration Examples of Semiconductor Device

Third to sixth configuration examples of the semiconductor device are described with reference to FIGS. 18 to 21.

Figure 18:
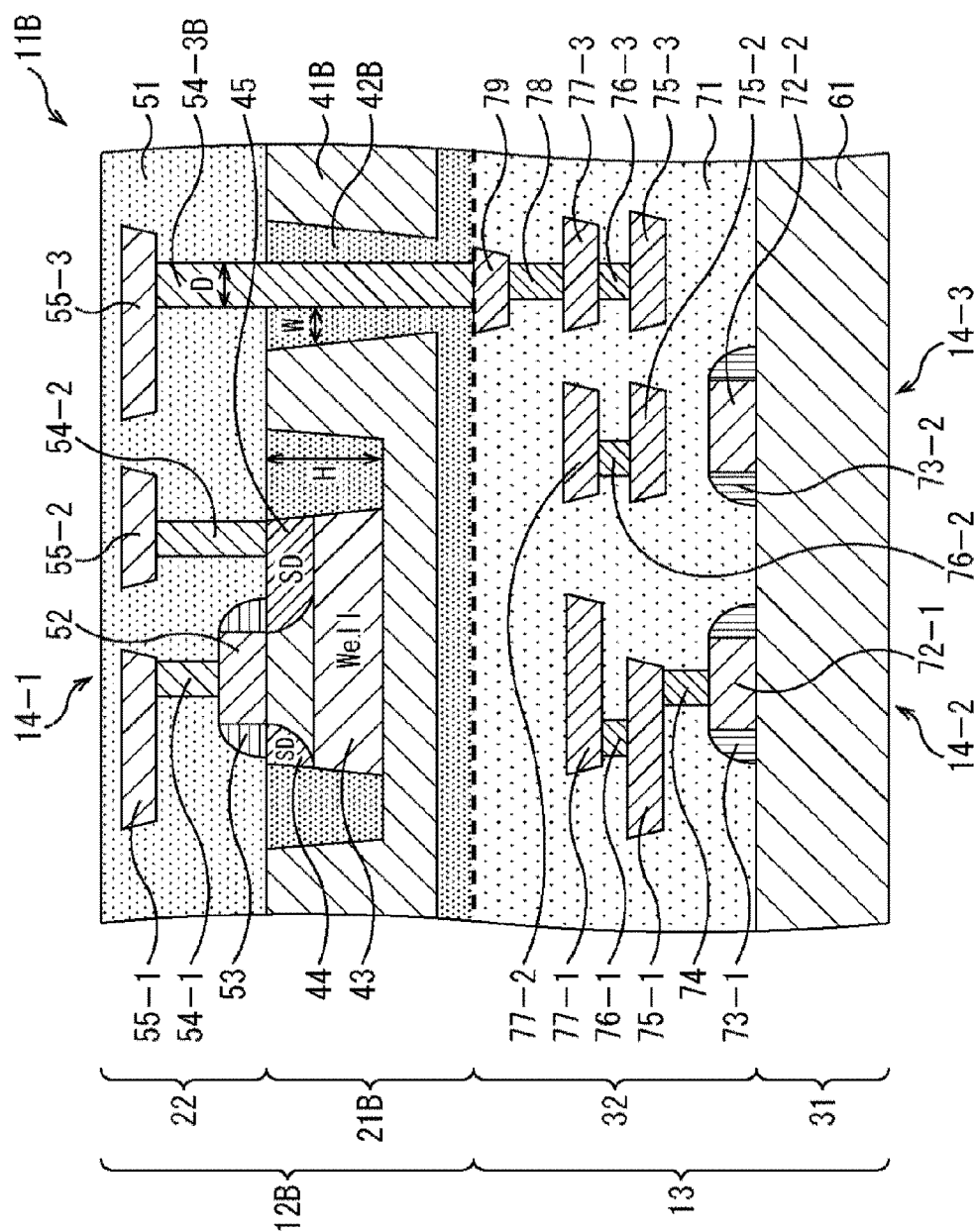
FIG. 18 is a cross-sectional view illustrating a configuration example of a third embodiment of a semiconductor device.

FIG. 18 is a cross-sectional view illustrating a configuration example of a third embodiment of a semiconductor device. Note that, in a semiconductor device 11B illustrated in FIG. 18, the same reference sign is given to a configuration common to that of the semiconductor device 11 in FIG. 1, and the detailed description thereof is not repeated.

As illustrated in FIG. 18, the semiconductor device 11B has a configuration of a semiconductor layer 21B of an upper silicon substrate 12B different from that of the semiconductor device 11 in FIG. 1, and other configurations are common with those of the semiconductor device 11 in FIG. 1.

For example, in the semiconductor device 11B, the semiconductor layer 21B is formed by using a semiconductor region 41B thicker than the semiconductor region 41 in FIG. 1. As a result, in the semiconductor device 11B, an embedded oxide film 42B in a region where a through via 54-3B is arranged is formed to be deeper than a depth in other regions, for example, in a region provided for isolating a MOS transistor 14-1 (depth H in FIG. 18: about 200 nm). Such embedded oxide film 42B may be realized, for example, by adding a process of differently forming a region for separating the MOS transistor 14-1 and a region in which the through via 54-3B is arranged to have different depths at a step of forming the element isolation.

The semiconductor device 11B formed in this manner may have, for example, a layout to apply substrate bias. In other words, in the semiconductor device 11B, the embedded oxide film 42B in the region where the through via 54-3B is arranged may be made deeper than an element isolation portion of the MOS transistor 14-1, thereby applying back bias to the MOS transistor 14-1.

Figure 19:
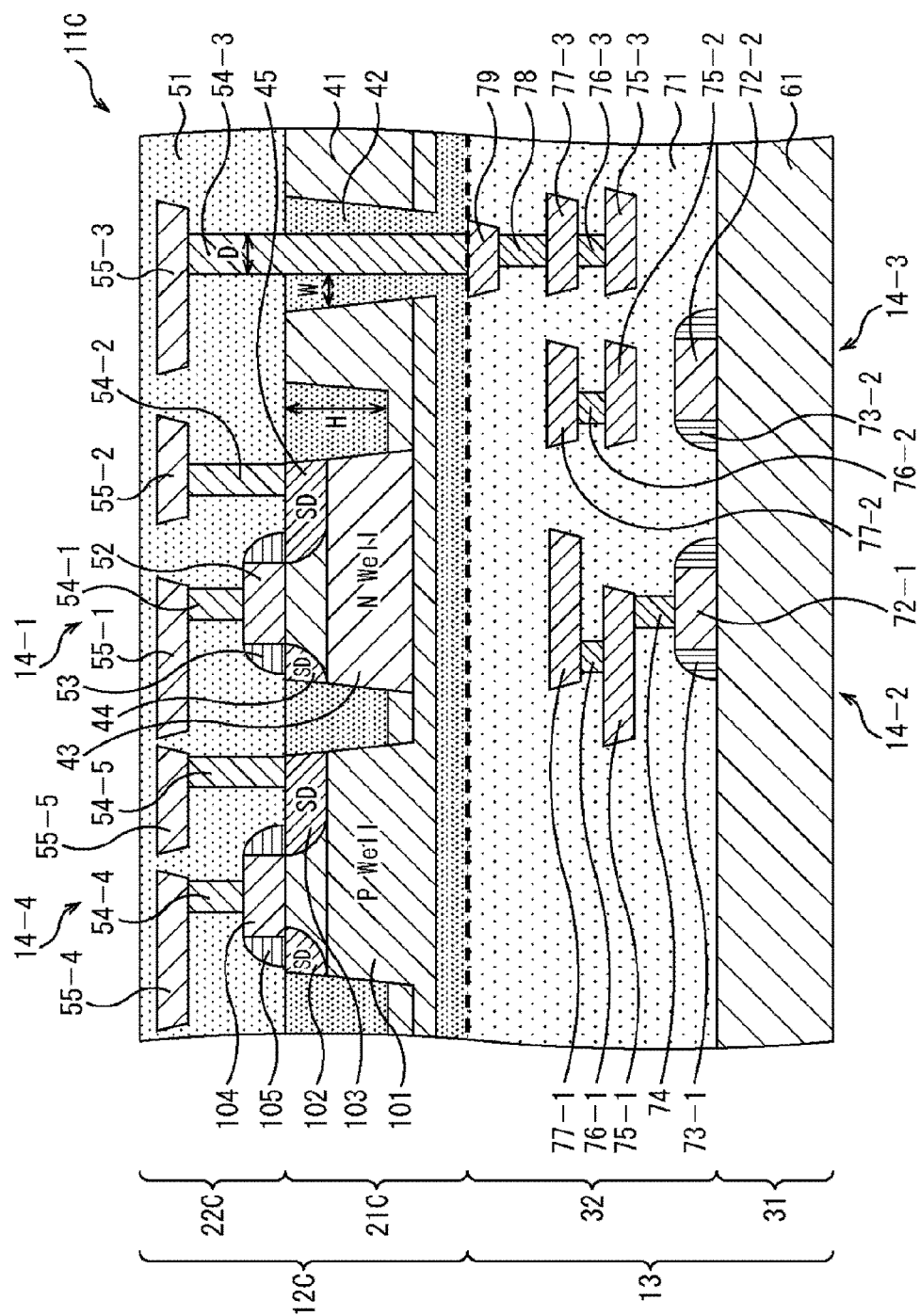
FIG. 19 is a cross-sectional view illustrating a configuration example of a fourth embodiment of a semiconductor device.

FIG. 19 is a cross-sectional view illustrating a configuration example of a fourth embodiment of a semiconductor device. Note that, in a semiconductor device 11C illustrated in FIG. 19, the same reference sign is given to a configuration common to that of the semiconductor device 11 in FIG. 1, and the detailed description thereof is not repeated.

As illustrated in FIG. 19, the semiconductor device 11C has configurations of a semiconductor layer 21C and a wiring layer 22C of an upper silicon substrate 12C different from those of the semiconductor device 11 in FIG. 1, and other configurations are common with those of the semiconductor device 11 in FIG. 1.

For example, the semiconductor device 11C is formed by a method of separating P-type and N-type in the semiconductor layer 21C, and a MOS transistor 14-4 is formed in a P-type well 101 so as to be separated from a MOS transistor 14-1 formed in an N-type well 43. In other words, in the semiconductor device 11C, a P-type semiconductor region and an N-type semiconductor region are differently formed in the semiconductor layer 21C, and in a case where a P-type substrate is used in the upper silicon substrate 12C, a well 101 having high P-type impurity density is formed on a back surface side of the upper silicon substrate 12C.

Then, in the semiconductor layer 21C, N-type regions 102 and 103 are formed in the P-type well 101, a gate electrode 104 is arranged on a surface therebetween, and a sidewall 105 is formed to surround a periphery of the gate electrode 104. Furthermore, in the wiring layer 22C, a wire 55-4 is connected to a gate electrode 104 via a contact electrode 54-4 and a wire 55-5 is connected to an N-type region 103 via a contact electrode 54-5.

As described above, in the semiconductor device 11C, the P-type substrate is used in the semiconductor layer 21C and a dense P-type well 101 is formed on a back surface thereof, so that a structure of suppressing leak current generated between the P-type well 101 and the N-type well 43 may be realized.

Figure 20:
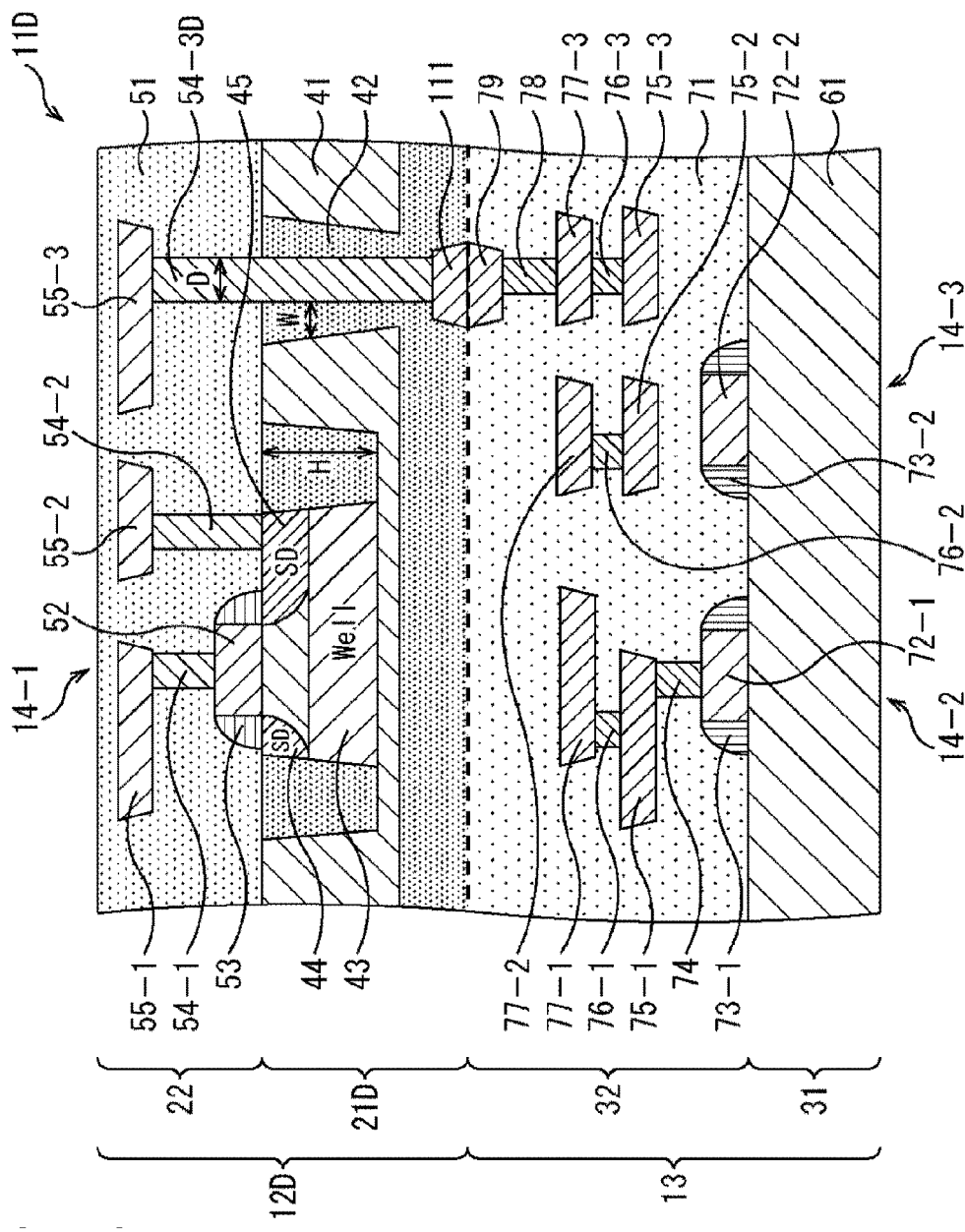
FIG. 20 is a cross-sectional view illustrating a configuration example of a fifth embodiment of a semiconductor device.

FIG. 20 is a cross-sectional view illustrating a configuration example of a fifth embodiment of a semiconductor device. Note that, in a semiconductor device 11D illustrated in FIG. 20, the same reference sign is given to a configuration common to that of the semiconductor device 11 in FIG. 1, and the detailed description thereof is not repeated.

As illustrated in FIG. 20, the semiconductor device 11D has a configuration of a semiconductor layer 21D of an upper silicon substrate 12D different from that of the semiconductor device 11 in FIG. 1, and other configurations are common with those of the semiconductor device 11 in FIG. 1.

In other words, in the semiconductor device 11D, a connecting electrode 111 is provided so as to be exposed on a back surface side of the semiconductor layer 21D, and a through via 54-3D is connected to the connecting electrode 111 having a size larger than a diameter of the through via 54-3D. Then, in the semiconductor device 11D, when the upper silicon substrate 12D and a lower silicon substrate 13 are joined, the connecting electrode 111 and an upper layer wire 79 are directly bonded.

The semiconductor device 11D configured in this manner may avoid occurrence of a situation in which sufficient connection strength cannot be obtained, a situation in which a resistance value cannot be lowered and the like depending on the diameter of the through via 54-3D. In other words, in the semiconductor device 11D, by providing the connecting electrode 111 having the size larger than the diameter of the through via 54-3D, the sufficient connection strength may be secured in joint to the lower silicon substrate 13, and the resistance value in a joint part may be suppressed. As a result, performance of the semiconductor device 11D may be improved.

Figure 21:
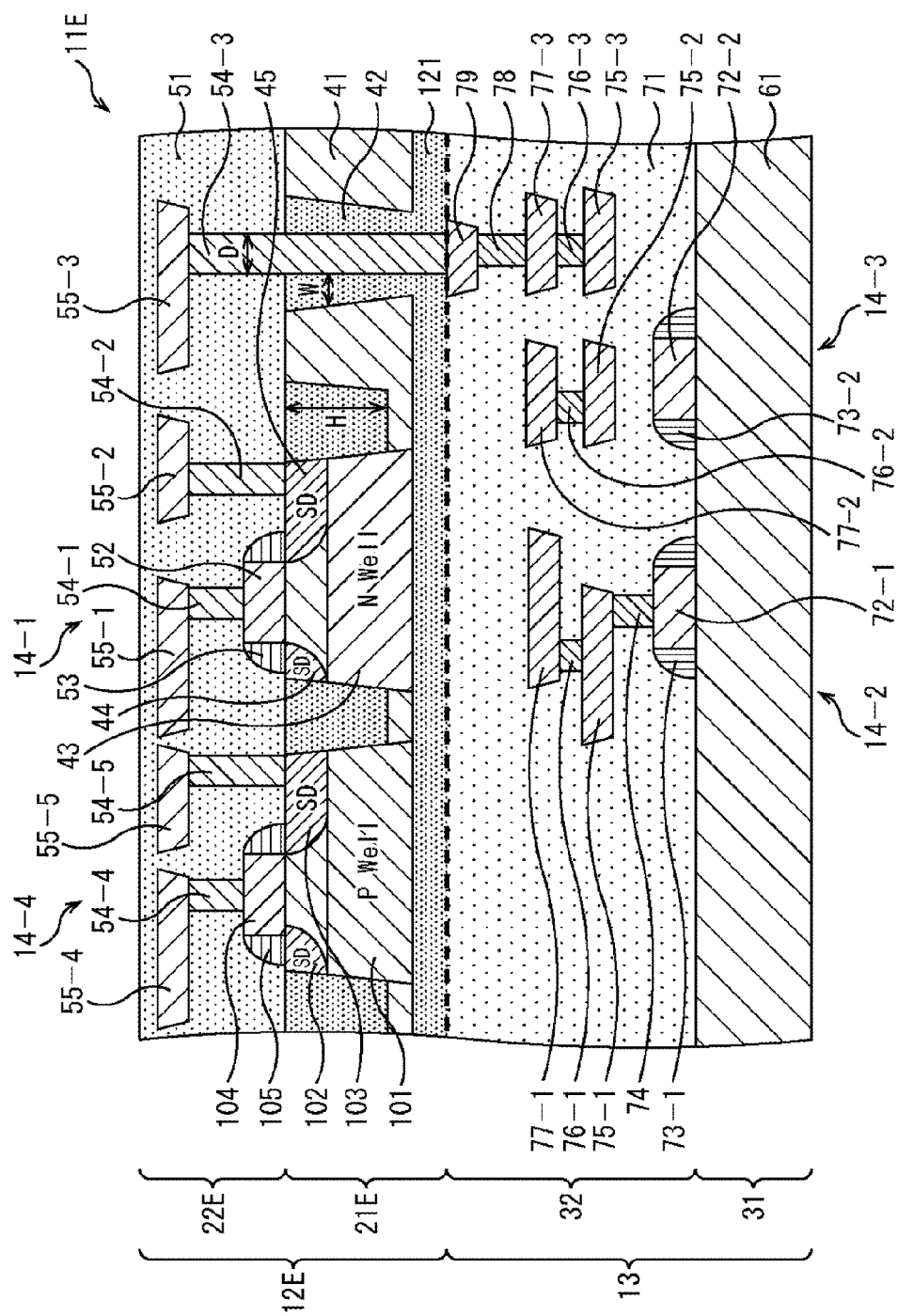
FIG. 21 is a cross-sectional view illustrating a configuration example of a sixth embodiment of a semiconductor device.

FIG. 21 is a cross-sectional view illustrating a configuration example of a sixth embodiment of a semiconductor device. Note that, in a semiconductor device 11E illustrated in FIG. 21, the same reference sign is given to a configuration common to that of the semiconductor device 11 in FIG. 1, and the detailed description thereof is not repeated.

As illustrated in FIG. 21, the semiconductor device 11E has configurations of a semiconductor layer 21E and a wiring layer 22E of an upper silicon substrate 12E different from those of the semiconductor device 11 in FIG. 1, and other configurations are common with those of the semiconductor device 11 in FIG. 1. Note that the semiconductor device 11E is a configuration example in which a MOS transistor 14-4 is provided as is the case of the semiconductor device 11C illustrated in FIG. 19 described above.

In the semiconductor device 11E, for example, a silicon on insulator (SOI) substrate is used in the semiconductor layer 21E, and a BOX film (thermal oxide film) of the SOI substrate is used as an oxide film 121 provided on a back surface of the semiconductor layer 21E.

The semiconductor device 11E configured in this manner may reduce steps of forming an insulating film in order to secure an insulation property of the back surface of the upper silicon substrate 12E.

Configuration Example of Image Sensor

An application example of the above-described semiconductor device 11 to an image sensor is described with reference to FIGS. 22 and 23. For example, the same process as that of a stacked CIS may be used as a step of connecting an upper silicon substrate 12 and a lower silicon substrate 13 of the semiconductor device 11, and a configuration of the semiconductor device 11 may be applied to the image sensor.

Figure 22:
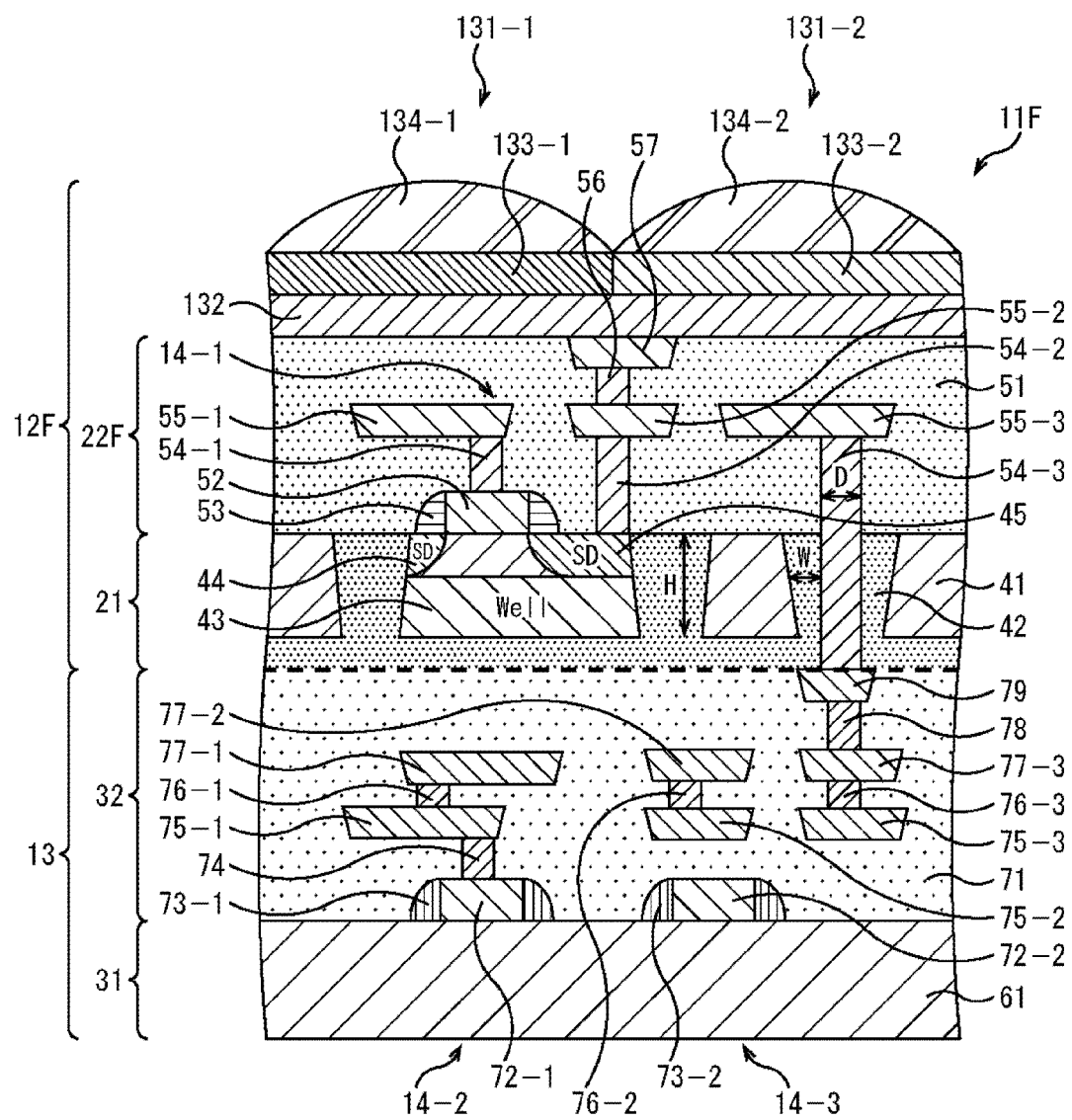
FIG. 22 is a cross-sectional view illustrating a configuration example of a seventh embodiment of a semiconductor device.

FIG. 22 is a cross-sectional view illustrating a first configuration example applied to the image sensor as a seventh embodiment of the semiconductor device. Note that, in a semiconductor device 11F illustrated in FIG. 22, the same reference sign is given to a configuration common to that of the semiconductor device 11 in FIG. 1, and the detailed description thereof is not repeated.

As illustrated in FIG. 22, in the semiconductor device 11F being the image sensor, an upper silicon substrate 12F is made a sensor substrate on which a pixel 131 is formed, a configuration of a semiconductor layer 21F is different from that of the semiconductor device 11 in FIG. 1, and other configurations are common to those of the semiconductor device 11 in FIG. 1.

For example, in the upper silicon substrate 12F, a photoelectric conversion layer 132 formed by using an organic film is stacked on a semiconductor layer 21F, and a color filter 133 and an on-chip lens 134 are stacked for each pixel 131. In the configuration example of the semiconductor device 11F illustrated in FIG. 22, a cross-section in a site where two pixels 131-1 and 131-2 are formed is illustrated. The pixel 131-1 is formed by stacking a color filter 133-1 and an on-chip lens 134-1 on the photoelectric conversion layer 132, and the pixel 131-2 is formed by stacking a color filter 133-2 and an on-chip lens 134-2 on the photoelectric conversion layer 132.

Furthermore, in a wiring layer 22F of the upper silicon substrate 12F, an upper layer wire 57 is provided so as to be exposed to a surface of the wiring layer 22F, and the upper layer wire 57 is connected to a wire 55-2 via a contact electrode 56.

In the semiconductor device 11F configured in this manner, a through via 54-3 may be used for connecting the upper silicon substrate 12F configured as the sensor substrate on which a plurality of pixels is arranged to the lower silicon substrate 13 used as a logic substrate which applies signal processing to a pixel signal output from the sensor substrate.

Note that, in the semiconductor device 11, as in the semiconductor device 11F, a backside irradiation type CMOS image sensor may be used in addition to a configuration in which an organic film is used in the photoelectric conversion layer 132.

Figure 23:
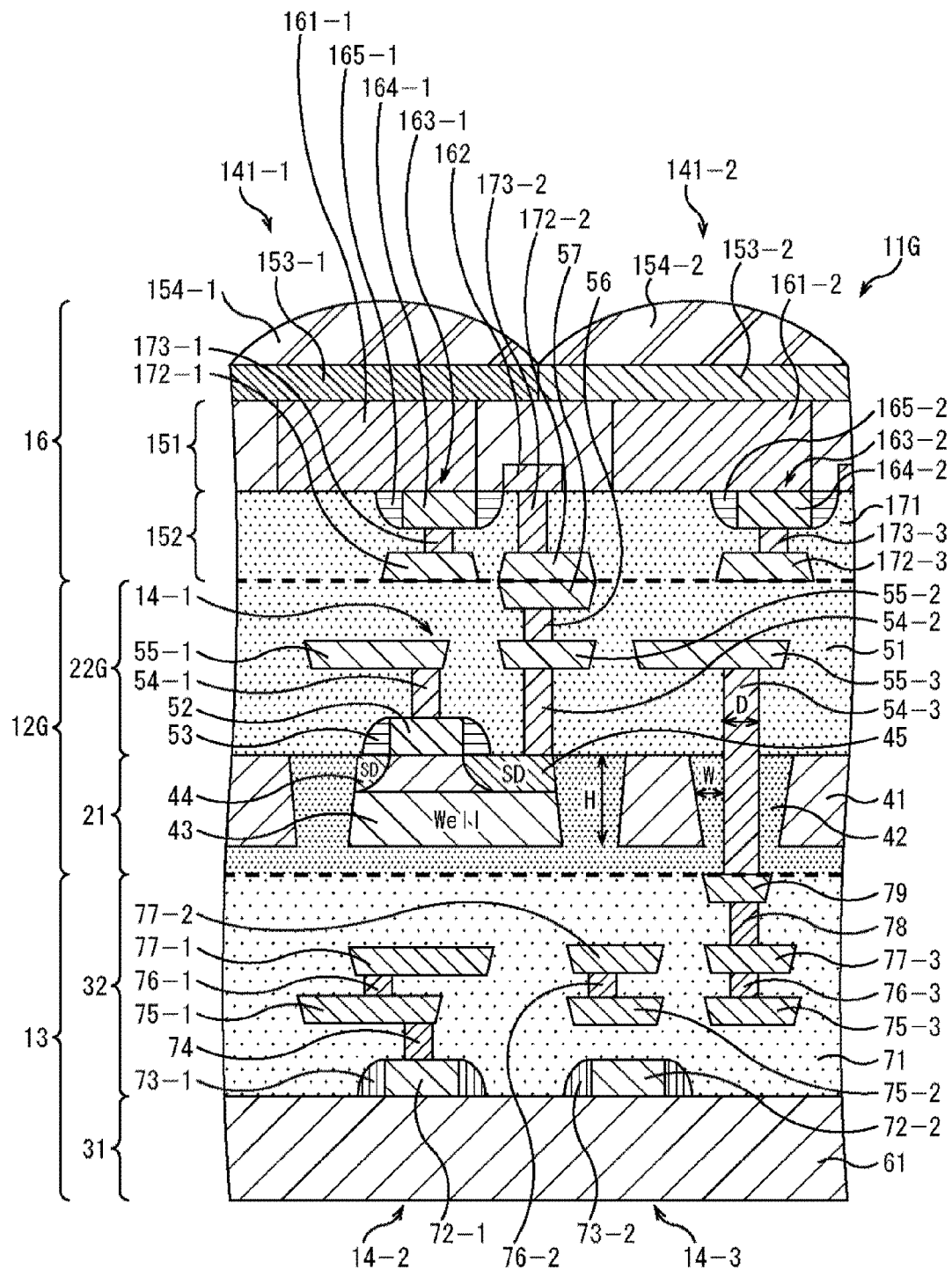
FIG. 23 is a cross-sectional view illustrating a configuration example of an eighth embodiment of a semiconductor device.

FIG. 23 is a cross-sectional view illustrating a second configuration example applied to the image sensor as an eighth embodiment of the semiconductor device. Note that, in a semiconductor device 11G illustrated in FIG. 23, the same reference sign is given to a configuration common to that of the semiconductor device 11 in FIG. 1, and the detailed description thereof is not repeated.

As illustrated in FIG. 23, the semiconductor device 11G being an image sensor has a three-layer stacked structure obtained by stacking a sensor substrate 16 on which a pixel 141 is formed, and an upper silicon substrate 12G and a lower silicon substrate 13 used as logic substrates.

Then, in the semiconductor device 11G, a configuration in which the sensor substrate 16 is stacked and a wiring layer 22G of the upper silicon substrate 12G is formed to be connected to the sensor substrate 16 is different from that of the semiconductor device 11 in FIG. 1, and other configurations are common to those of the semiconductor device 11 in FIG. 1. Furthermore, as is the case with the wiring layer 22F in FIG. 22, an upper layer wire 57 for connecting to the sensor substrate 16 is provided in the wiring layer 22G.

The sensor substrate 16 is a so-called backside irradiation type CMOS image sensor in which a wiring layer 152 is stacked on a surface of a semiconductor layer 151 and a color filter 153 and an on-chip lens 154 are stacked on a back surface of the semiconductor layer 151.

In a configuration example of the semiconductor device 11G illustrated in FIG. 23, a cross-section in a site where two pixels 141-1 and 141-2 are formed is illustrated.

The pixel 141-1 is obtained by forming a photodiode 161-1 on a semiconductor layer 151, stacking a color filter 153-1 and an on-chip lens 154-1 on a back surface side of the semiconductor layer 151, and forming a MOS transistor 163-1 on a surface side of the semiconductor layer 151. In the MOS transistor 163-1, a sidewall 165-1 is formed to surround a periphery of a gate electrode 164-1, and the gate electrode 164-1 is connected to an upper layer wire 172-1 via a contact electrode 173-1. Furthermore, a FD unit 162 is formed via the MOS transistor 163-1 in the semiconductor layer 151, the FD unit 162 is connected to an upper layer wire 172-2 via a contact electrode 173-2, and the upper layer wire 172-2 and the upper layer wire 57 are joined by direct bonding.

A pixel 141-2 is obtained by forming a photodiode 161-2 on the semiconductor layer 151, stacking a color filter 153-2 and an on-chip lens 154-2 on the back surface side of the semiconductor layer 151, and forming a MOS transistor 163-2 on the surface side of the semiconductor layer 151. In the MOS transistor 163-2, a sidewall 165-2 is formed to surround a periphery of a gate electrode 164-2, and the gate electrode 164-2 is connected to an upper layer wire 172-3 via a contact electrode 173-3. Note that, although not illustrated, an FD unit is formed as in the pixel 141-1.

In the semiconductor device 11G configured in this manner, a through via 54-3 may be used for connecting the upper silicon substrate 12G and the lower silicon substrate 13 used as the logic substrates which apply signal processing to a pixel signal output from the sensor substrate 16. Furthermore, depending on the structure of the semiconductor device 11G, the through via 54-3 may be applied to connect all the substrates from the sensor substrate 16 to the lower silicon substrate 13.

Note that, the present technology is not limited to the application to the image sensor, and is applicable to, for example, a DRAM memory and the like. Furthermore, the present technology is applicable to a semiconductor device having a multi-layer structure of two or more layers.

Note that, the semiconductor device 11F or 11G applied to the image sensor as described above is applicable to various electronic devices such as an imaging system such as a digital still camera and a digital video camera, a portable phone having an imaging function, or another device having the imaging function.

Configuration Example of Imaging Device

Figure 24:
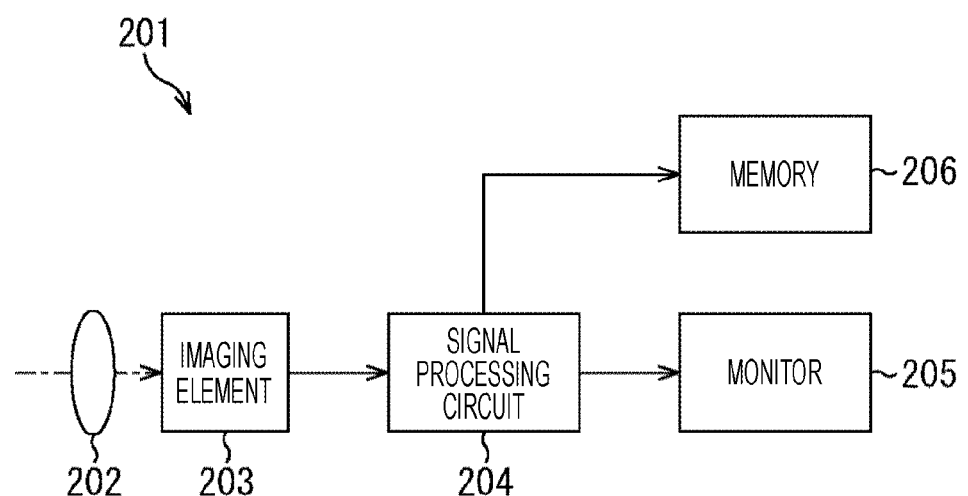
FIG. 24 is a block diagram illustrating a configuration example of an imaging device.

FIG. 24 is a block diagram illustrating a configuration example of an imaging device mounted on an electronic device.

As illustrated in FIG. 24, an imaging device 201 provided with an optical system 202, an imaging element 203, a signal processing circuit 204, a monitor 205, and a memory 206 may take a still image and a moving image.

The optical system 202 including one or a plurality of lenses guides image light from an object (incident light) to the imaging element 203 to form an image on a light-receiving surface (sensor unit) of the imaging element 203.

As the imaging element 203, the above-described semiconductor device 11F or 11G is applied. Electrons are accumulated in the imaging element 203 for a certain period in accordance with the image formed on the light-receiving surface via the optical system 202. Then, a signal corresponding to the electrons accumulated in the imaging element 203 is supplied to the signal processing circuit 204.

The signal processing circuit 204 performs various types of signal processing on the pixel signal output from the imaging element 203. The image (image data) obtained by the signal processing applied by the signal processing circuit 204 is supplied to the monitor 205 to be displayed or supplied to the memory 206 to be stored (recorded).

By applying the semiconductor device 11F or 11G described above, the imaging device 201 configured in this manner may achieve, for example, further cost reduction.

Usage Example of Image Sensor

Figure 25:
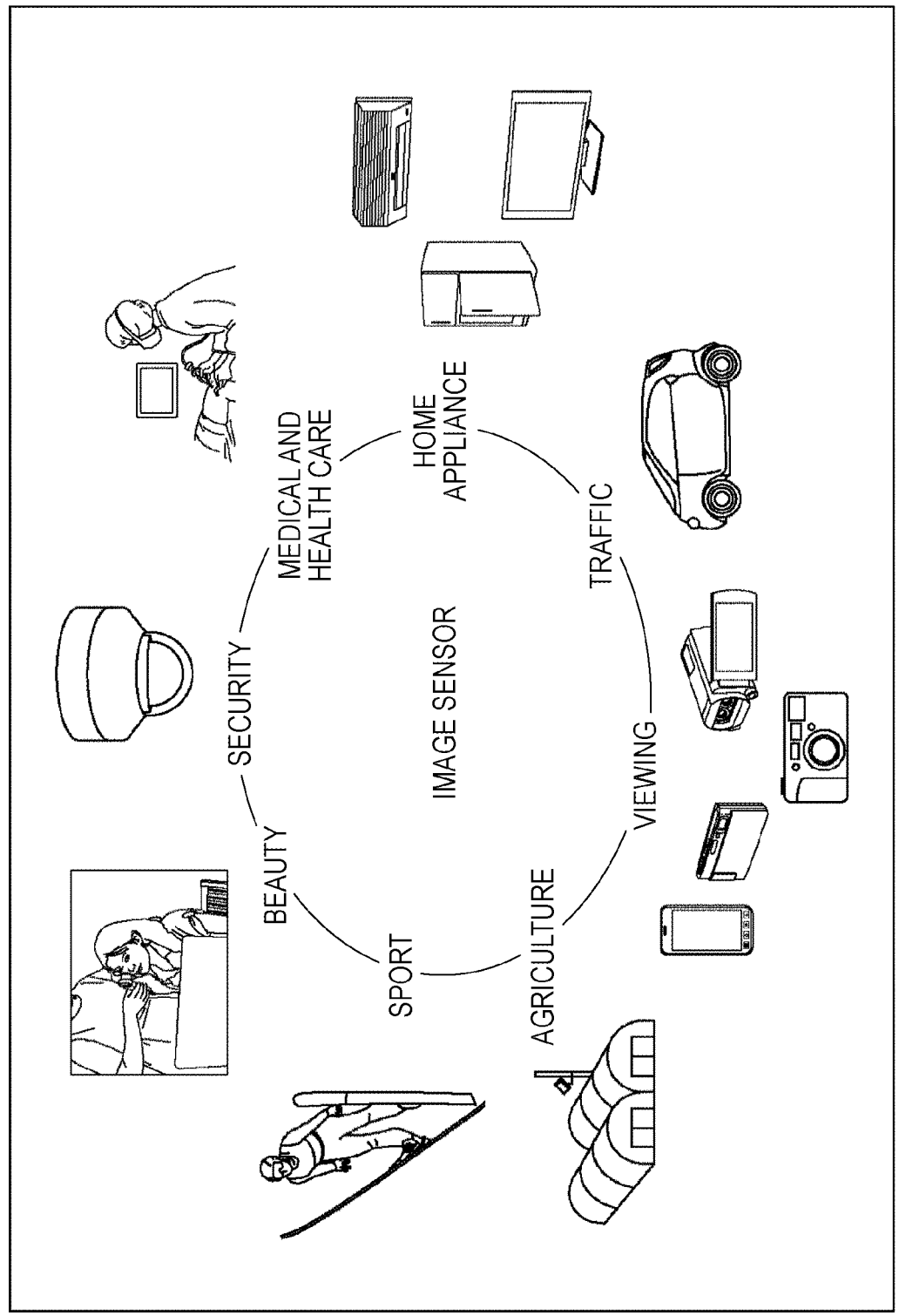
FIG. 25 is a view illustrating a usage example to use an image sensor.

FIG. 25 is a view illustrating a usage example to use the above-described image sensor.

The above-described image sensor may be used in various cases in which light such as visible light, infrared light, ultraviolet light, and X-ray is sensed as hereinafter described, for example.

- A device which takes an image to be used for viewing such as a digital camera and a portable device with a camera function
- A device for traffic purpose such as an in-vehicle sensor which takes images of the front, rear, surroundings, interior and the like of an automobile, a surveillance camera for monitoring traveling vehicles and roads, and a ranging sensor which measures a distance between vehicles and the like for safe driving such as automatic stop, recognition of a driver's condition, and the like.
- A device for home appliance such as a television, a refrigerator, and an air conditioner which takes an image of a user's gesture and performs device operation according to the gesture
- A device for medical and health care use such as an endoscope and a device which performs angiography by receiving infrared light
- A device for security use such as a security monitoring camera and an individual certification camera
- A device for beauty care such as a skin condition measuring device which takes an image of skin and a microscope which takes an image of scalp
- A device for sporting use such as an action camera and a wearable camera for sporting use and the like
- A device for agricultural use such as a camera for monitoring land and crop states Combination Example of Configurations Note that, the present technology may also have following configurations.

(1)

A semiconductor device including:
a first semiconductor substrate in which a first wiring layer is stacked on a first semiconductor layer;
a second semiconductor substrate in which a second wiring layer is stacked on a second semiconductor layer; and
a through via which electrically connects the first semiconductor substrate and the second semiconductor substrate to each other in a stacked structure obtained by stacking at least the first semiconductor substrate and the second semiconductor substrate and penetrates at least the first semiconductor layer,
in which the through via is formed in an embedded oxide film formed when element isolation of a semiconductor element formed in the first semiconductor layer is performed.

(2)

The semiconductor device according to (1) described above,
in which the through via is formed by using same conductive metal as conductive metal of a contact electrode which connects a wire arranged in the first wiring layer and the semiconductor element formed in the first semiconductor layer.

(3)

The semiconductor device according to (1) described above,
in which the through via is formed by using same conductive metal as conductive metal of a wire arranged in the first wiring layer.

(4)

The semiconductor device according to any one of (1) to (3) described above,
in which a thickness of the first semiconductor layer penetrated by the through via is substantially same as a thickness of an element isolation portion of the semiconductor element formed in the first semiconductor layer, or not larger than the thickness of the element isolation portion of the semiconductor element formed in the first semiconductor layer.

(5)

The semiconductor device according to any one of (1) to (3),
in which the embedded oxide film in which the through via is formed is formed deeper than an element isolation portion of the semiconductor element formed in the first semiconductor layer.

(6)

The semiconductor device according to any one of (1) to (5) described above,
in which, in the first semiconductor layer of the first semiconductor substrate, a semiconductor region of a first type and a semiconductor region of a second type different from the first type are formed differently, and in a case where a substrate of the first type is used in the first semiconductor substrate, a layer of the first type with high impurity density is formed on a back surface side of the first semiconductor substrate.

(7)

A manufacturing method of a semiconductor device of a stacked structure obtained by stacking at least a first semiconductor substrate in which a first wiring layer is stacked on a first semiconductor layer and a second semiconductor substrate in which a second wiring layer is stacked on a second semiconductor layer,
the manufacturing method including a step of
electrically connecting the first semiconductor substrate and the second semiconductor substrate to each other in the stacked structure obtained by stacking at least the first semiconductor substrate and the second semiconductor substrate, and forming a through via which penetrates at least the first semiconductor layer in an embedded oxide film formed when element isolation of a semiconductor element formed in the first semiconductor layer is performed.

(8)

An imaging element including:
a sensor substrate in which a first wiring layer is stacked on a first semiconductor layer;
a logic substrate in which a second wiring layer is stacked on a second semiconductor layer; and
a through via which electrically connects the sensor substrate and the logic substrate to each other in a stacked structure obtained by stacking at least the sensor substrate and the logic substrate and penetrates at least the first semiconductor layer,
in which the through via is formed in an embedded oxide film formed when element isolation of a semiconductor element formed in the first semiconductor layer is performed.

(9)

An electronic device including
an imaging element including:
a sensor substrate in which a first wiring layer is stacked on a first semiconductor layer;
a logic substrate in which a second wiring layer is stacked on a second semiconductor layer; and a through via which electrically connects the sensor substrate and the logic substrate to each other in a stacked structure obtained by stacking at least the sensor substrate and the logic substrate and penetrates at least the first semiconductor layer, in which the through via is formed in an embedded oxide film formed when element isolation of a semiconductor element formed in the first semiconductor layer is performed.

Note that, the embodiments are not limited to the above-described embodiments and may be variously changed without departing from the gist of the present disclosure. Furthermore, the effects described in this specification are illustrative only and are not limitative; there may also be another effect.

REFERENCE SIGNS LIST

11 Semiconductor device
12 Upper silicon substrate
13 Lower silicon substrate
14 MOS transistor
15 Support substrate
16 Sensor substrate
21 Semiconductor substrate
22 Wiring layer
31 Semiconductor layer
32 Wiring layer
41 Semiconductor region
42 Embedded oxide film
43 N-type well
44, 45 P-type region
51 Insulating film
52 Gate electrode
53 Sidewall
54 Contact electrode
55 Wire
56 Contact electrode
57 Upper layer wire
61 Semiconductor region
71 Insulating film
72 Gate electrode
73 Sidewall
74 Contact electrode
75 Wire
76 Contact electrode
77 Wire
78 Contact electrode
79 Upper layer wire

What is claimed is:

1. A semiconductor device, comprising:
a first structure including a first semiconductor substrate and a first multilayer wiring layer on the first semiconductor substrate;
a second structure including a second semiconductor substrate and a second multilayer wiring layer on the second semiconductor substrate, wherein the second structure includes a transistor;
a third structure including a third semiconductor substrate and a third multilayer wiring layer on the third semiconductor substrate, wherein the second structure is between the first structure and the third structure;
an oxide film that contacts at least one of a source or a drain of the transistor; and
a through via that penetrates a layer included in the second structure,
wherein the second structure and the third structure are electrically connected by at least the through via,
wherein the first multilayer wiring layer includes a first electrode at a first surface side of the first multilayer wiring layer,
wherein the second multilayer wiring layer includes a second electrode at a first surface side of the second multilayer wiring layer,
wherein the first electrode is bonded to the second electrode at a bonding surface where the first structure is bonded to the second structure,
wherein the second semiconductor substrate is at a second surface side of the second multilayer wiring layer that is opposite to the first surface side of the second multilayer wiring layer,
wherein the third multilayer wiring layer includes a third electrode electrically connected to the through via,
wherein the first electrode and the second electrode are electrically connected to and overlap with at least part of the transistor in a plan view, and
wherein, in the plan view, the through via and the third electrode overlap one another and are offset from the first electrode, the second electrode, and the transistor in a lateral direction.

2. The semiconductor device according to claim 1, wherein a gate electrode of the transistor is at the second surface side of the second multilayer wiring layer.

3. The semiconductor device according to claim 1, wherein the second multilayer wiring layer includes a wire, and wherein the second electrode is connected to the wire by a via.

4. The semiconductor device according to claim 3, wherein the wire is electrically connected to the part of the transistor.

5. The semiconductor device according to claim 1, wherein, in a cross sectional view, a location where the first electrode is bonded to the second electrode is offset in a lateral direction from a location where the third electrode is bonded to the through via.

6. The semiconductor device according to claim 2, wherein the second structure includes a fourth electrode, and wherein the through via is electrically connected to the second multilayer wiring layer and the fourth electrode.

7. The semiconductor device according to claim 5, wherein the through via penetrates the oxide film.

8. The semiconductor device according to claim 7, wherein the oxide film has a taper shape in a sectional view.

9. The semiconductor device according to claim 7, wherein a diameter of the through via is larger than a width of the oxide film.

10. The semiconductor device according to claim 7, wherein a depth of the oxide film is larger than a width of the oxide film.

11. A semiconductor device, comprising:
a first structure including a first semiconductor substrate and a first multilayer wiring layer on the first semiconductor substrate;
a second structure including a second semiconductor substrate and a second multilayer wiring layer on the second semiconductor substrate, wherein the second structure includes a transistor;
a third structure including a third semiconductor substrate and a third multilayer wiring layer on the third semiconductor substrate, wherein the second structure is between the first structure and the third structure;

an oxide film that contacts at least one of a source or a drain of the transistor; and a through via that penetrates a layer included in the second structure, wherein the first multilayer wiring layer includes a first electrode, wherein the second multilayer wiring layer includes a second electrode, wherein the first electrode is bonded to the second electrode at a bonding surface where the first structure is bonded to the second structure, wherein the second electrode is electrically connected to a part of the transistor included in the second structure, wherein the third multilayer wiring layer includes a third electrode electrically connected to the through via, wherein the first electrode and the second electrode are electrically connected to and overlap with the part of the transistor in a plan view, and wherein, in the plan view, the through via and the third electrode overlap one another and are offset from the first electrode, the second electrode, and the transistor in a lateral direction.

12. The semiconductor device according to claim 11, wherein the second multilayer wiring layer further includes a wire, and wherein the second electrode is electrically connected to the wire.

13. The semiconductor device according to claim 12, wherein the wire in the second multilayer wiring layer is electrically connected between the second electrode and the part of the transistor.

14. An imaging device, comprising:

a first structure including a pixel structure and a first multilayer wiring layer, wherein the pixel structure includes a photodiode;

a second structure including a second semiconductor substrate and a second multilayer wiring layer on the second semiconductor substrate, wherein the second structure includes a transistor;

a third structure including a third semiconductor substrate and a third multilayer wiring layer on the third semiconductor substrate, wherein the second structure is between the first structure and the third structure;

an oxide film that contacts at least one of a source or a drain of the transistor; and a through via that penetrates a layer included in the second structure, wherein the second structure and the third structure are electrically connected by at least the through via, wherein the first multilayer wiring layer includes a first electrode, wherein the second multilayer wiring layer includes a second electrode, wherein the first electrode is bonded to the second electrode at a bonding surface where the first structure is bonded to the second structure, wherein the second electrode is electrically connected to a part of the transistor, wherein the third multilayer wiring layer includes a third electrode electrically connected to the through via, wherein the first electrode and the second electrode are electrically connected to and overlap with the part of the transistor in a plan view, and wherein, in the plan view, the through via and the third electrode overlap one another and are offset from the first electrode, the second electrode, and the transistor in a lateral direction.

15. The imaging device according to claim 14, wherein the pixel structure includes a floating diffusion, and wherein the floating diffusion is electrically connected to and overlaps with the first electrode in the plan view.

16. The imaging device according to claim 14, wherein the through via penetrates the oxide film.

17. The imaging device according to claim 16, wherein the oxide film has a taper shape in a sectional view.

18. The imaging device according to claim 16, wherein a diameter of the through via is larger than a width of the oxide film.

19. The imaging device according to claim 16, wherein a depth of the oxide film is larger than a width of the oxide film.

* * * * *